(12) United States Patent
Zhang et al.

(10) Patent No.: US 8,085,083 B2
(45) Date of Patent: Dec. 27, 2011

(54) CURRENT-SOURCE GATE DRIVER

(75) Inventors: Zhiliang Zhang, Kingston (CA); Yan-Fei Liu, Kingston (CA)

(73) Assignee: Queen's University at Kingston, Kingston, Ontario (CA)

( * ) Notice: Subject to any disclaimer, the term of this patent is extended or adjusted under 35 U.S.C. 154(b) by 0 days.

(21) Appl. No.: 12/379,481

(22) Filed: Feb. 23, 2009

(65) Prior Publication Data

US 2010/0019807 A1 Jan. 28, 2010

Related U.S. Application Data

(60) Provisional application No. 61/064,233, filed on Feb. 22, 2008.

(51) Int. Cl.
*H03K 17/687* (2006.01)
(52) U.S. Cl. ........................................... 327/427
(58) Field of Classification Search ................. None
See application file for complete search history.

(56) References Cited

U.S. PATENT DOCUMENTS

| | | | |
|---|---|---|---|
| 5,010,261 A * | 4/1991 | Steigerwald | 327/404 |
| 5,808,879 A * | 9/1998 | Liu et al. | 363/17 |
| 5,994,929 A * | 11/1999 | Sano et al. | 327/111 |
| 6,268,758 B1 * | 7/2001 | Limmer et al. | 327/424 |
| 6,744,219 B2 * | 6/2004 | Neidlinger | 315/224 |
| 6,911,848 B2 | 6/2005 | Vinciarelli | |
| 6,930,893 B2 | 8/2005 | Vinciarelli | |
| 6,934,166 B2 | 8/2005 | Vinciarelli | |
| 6,975,098 B2 | 12/2005 | Vinciarelli | |
| 6,984,965 B2 | 1/2006 | Vinciarelli | |
| 7,091,752 B2 * | 8/2006 | Balakrishnan | 327/108 |
| 7,145,786 B2 | 12/2006 | Vinciarelli | |
| 7,161,342 B2 * | 1/2007 | Sutardja | 323/351 |
| 7,466,170 B2 * | 12/2008 | Balakrishnan | 327/112 |
| 7,612,602 B2 * | 11/2009 | Yang et al. | 327/494 |
| 7,714,624 B2 * | 5/2010 | Takasu et al. | 327/110 |
| 2002/0118003 A1 | 8/2002 | Wald et al. | |
| 2006/0290388 A1 * | 12/2006 | Tolle et al. | 327/108 |

OTHER PUBLICATIONS

Chen, Y., et al., "A resonant MOSFET gate driver with efficient energy recovery", IEEE Trans. Power Electron 19(2): 470-477 (Mar. 2004).
Huber, L., et al., "1.8-MHz, 48-V resonant VRM: analysis, design, and performance evaluation", IEEE Trans. Power Electron 21(1): 79-88 (Jan. 2006).
Ren, Y., et al., "12V VR efficiency improvement based on two-stage approach and a novel gate driver", Proc. IEEE PESCP, pp. 2635-2641 (2005).

(Continued)

*Primary Examiner* — Lincoln Donovan
*Assistant Examiner* — Khareem E Almo
(74) *Attorney, Agent, or Firm* — Stephen J. Scribner; Carol Miernicki Steeg

(57) ABSTRACT

Provided is a current-source gate driver for use with a switching device having a gate capacitance, including an input terminal for receiving a DC voltage; a first switch connected between the input terminal and an output terminal; a second switch connected between the output terminal and a circuit common; a series circuit comprising a first capacitor and an inductor, the series circuit connected between the input terminal and the output terminal; wherein the gate capacitance of the switching device is connected between the output terminal and the circuit common. The current-source gate driver improves efficiency of the power switching devices of a voltage regulator module or other switching converter.

27 Claims, 21 Drawing Sheets

OTHER PUBLICATIONS

Xu, M., et al., "1-MHz self-driven ZVS full-bridge converter for 48-V power pod and DC/DC brick", IEEE Trans. Power Electron., 20(6): 997-1006 (Sep. 2005).

Yang, Z., et al., "A new resonant gate drive circuit for synchronous buck converter", IEEE Trans. Power Electron. 22(4): 1311-1320 (Jul. 2007).

Zhang, Z., et al., "Topology and analysis of a new resonant gate driver", Proc. IEEE PESC, Jeju, Korea, pp. 1453-1459 (2006).

Zhou, J., et al., "A self-driven soft-switching voltage regulator for future microprocessors", IEEE Trans. Power Electron. 20(4): 806-814 (Jul. 2005).

* cited by examiner

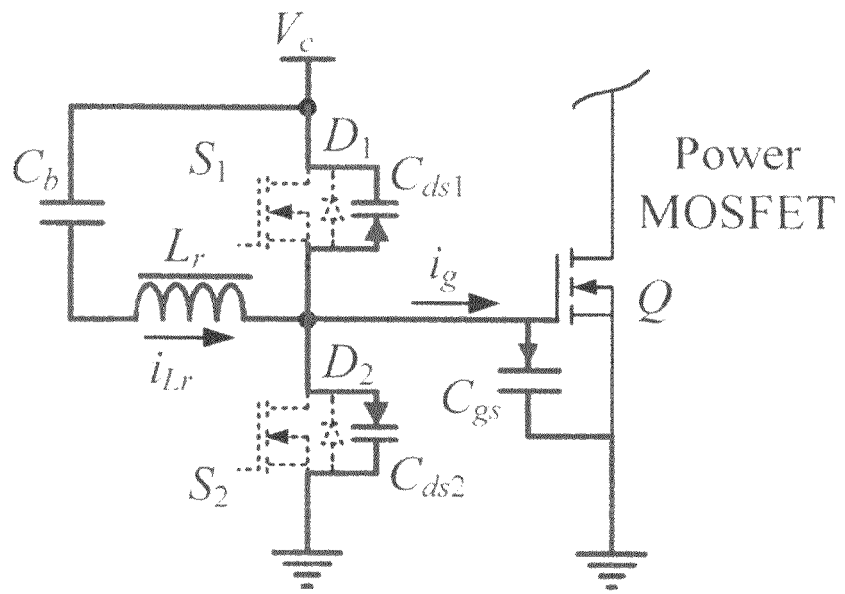
Figure 3A [$t_0, t_1$]
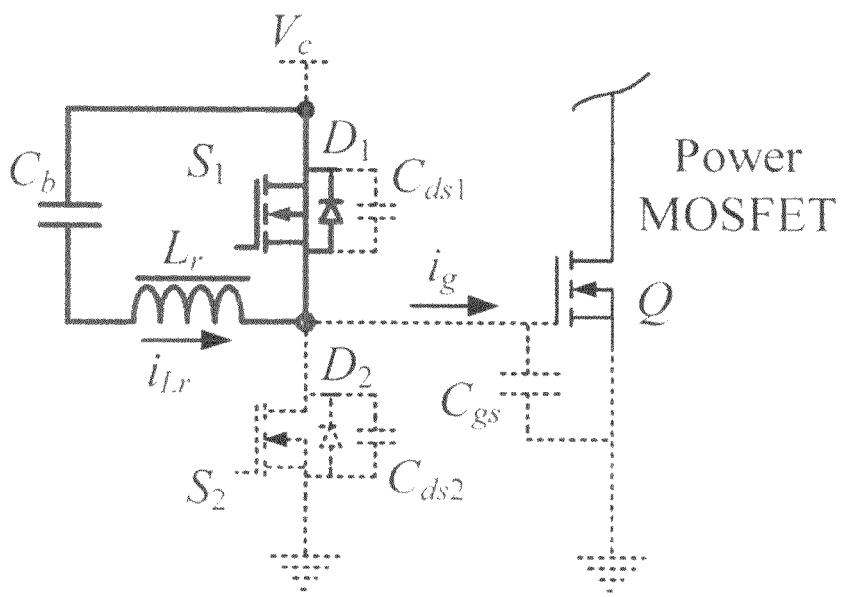
Figure 3B [$t_1, t_2$]

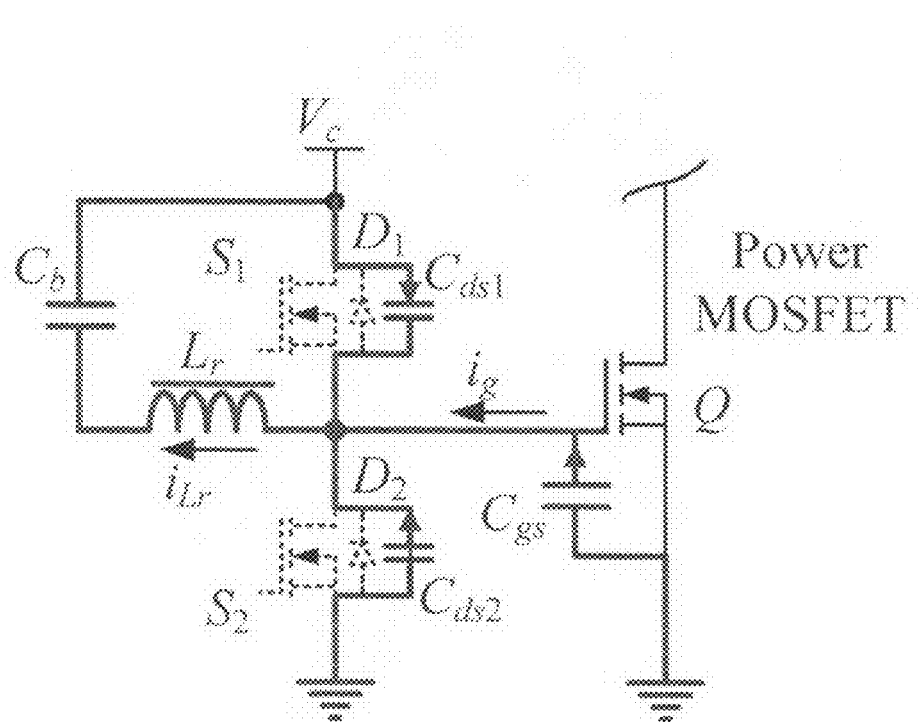
Figure 3C [$t_2$, $t_3$]
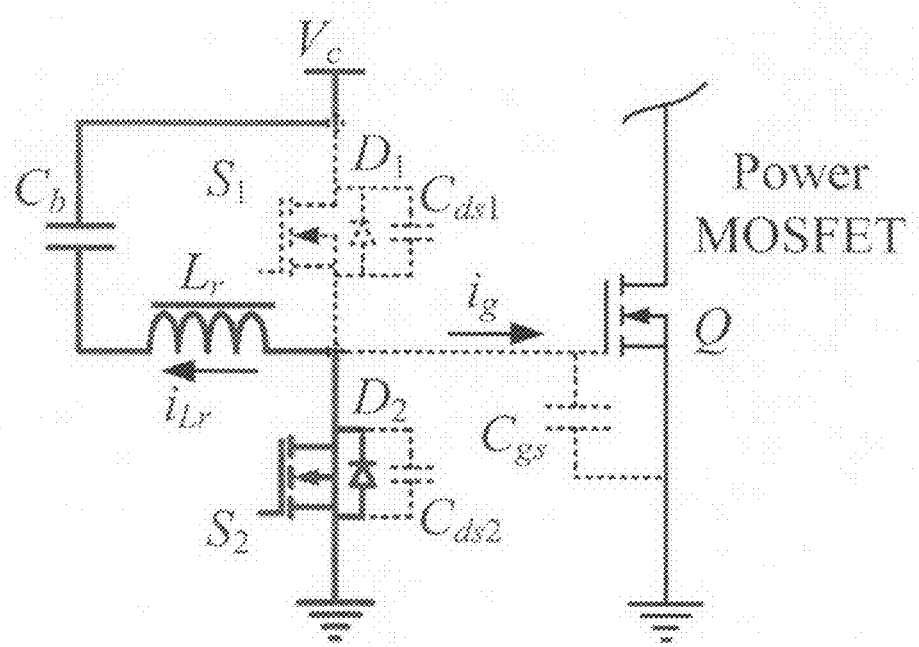
Figure 3D [$t_3$, $t_4$]

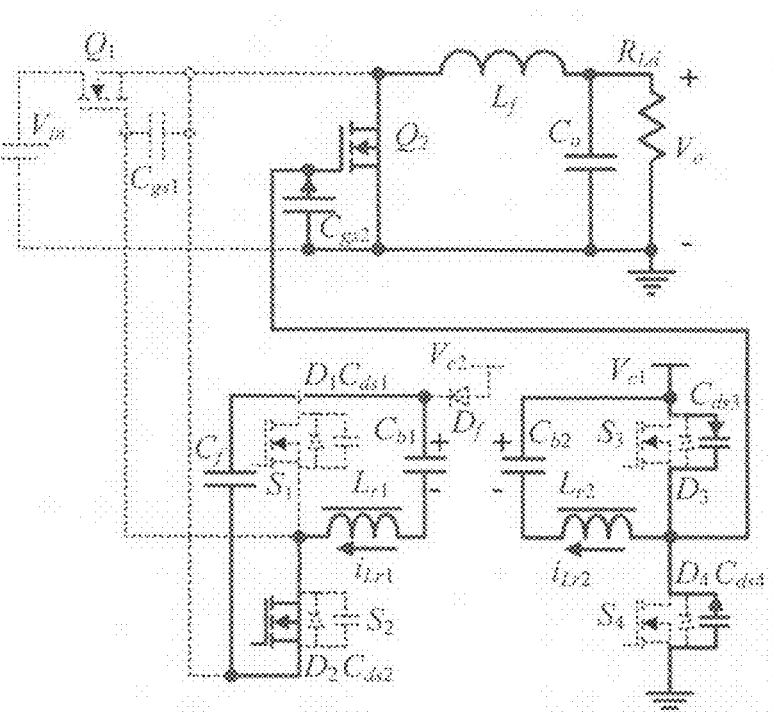
Figure 9A [$t_0$, $t_1$]
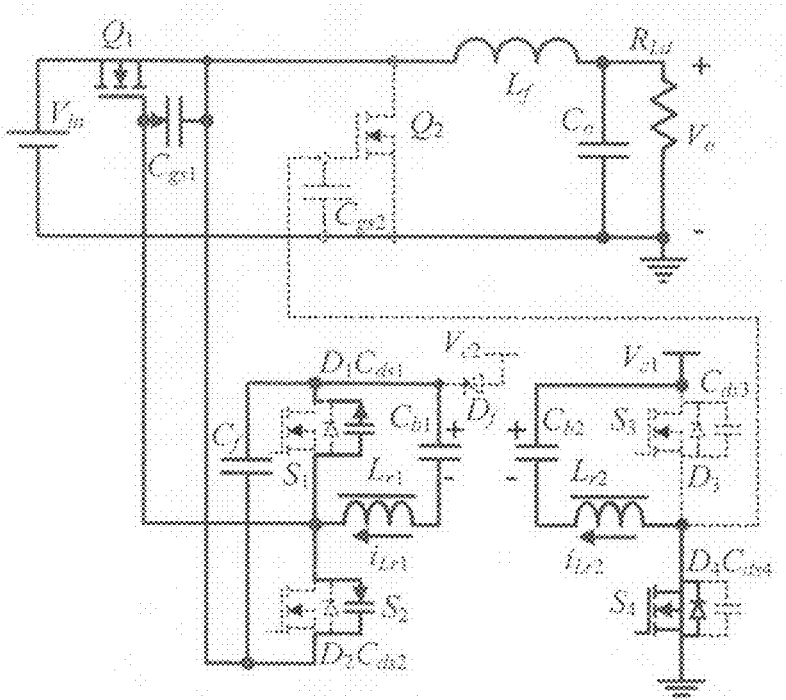
Figure 9B [$t_1$, $t_2$]

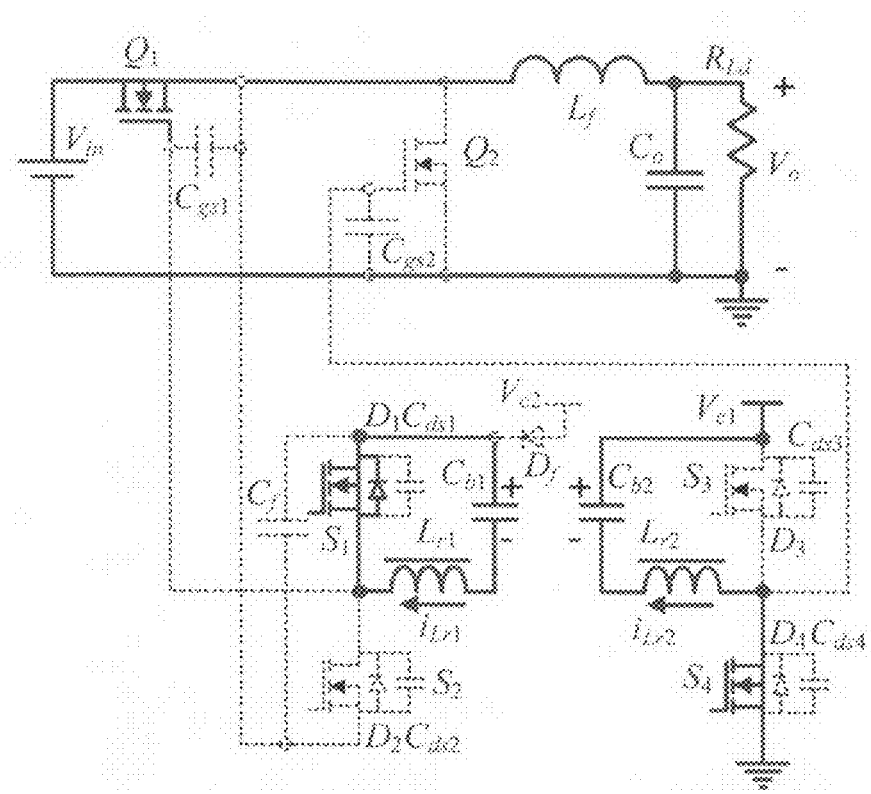
Figure 9C [$t_2, t_3$]
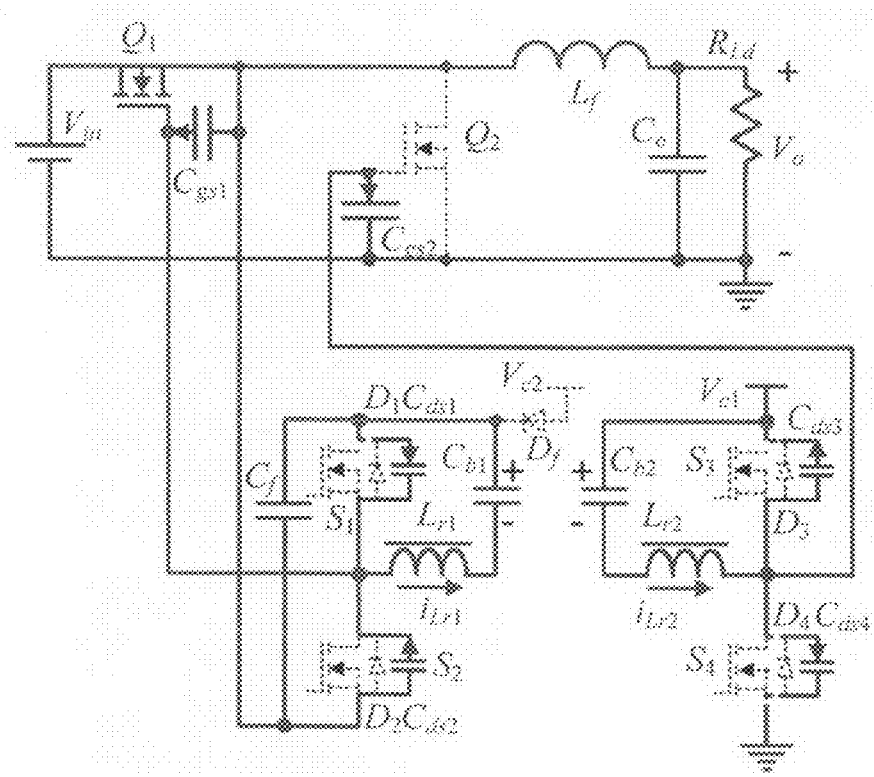
Figure 9D [$t_3, t_4$]

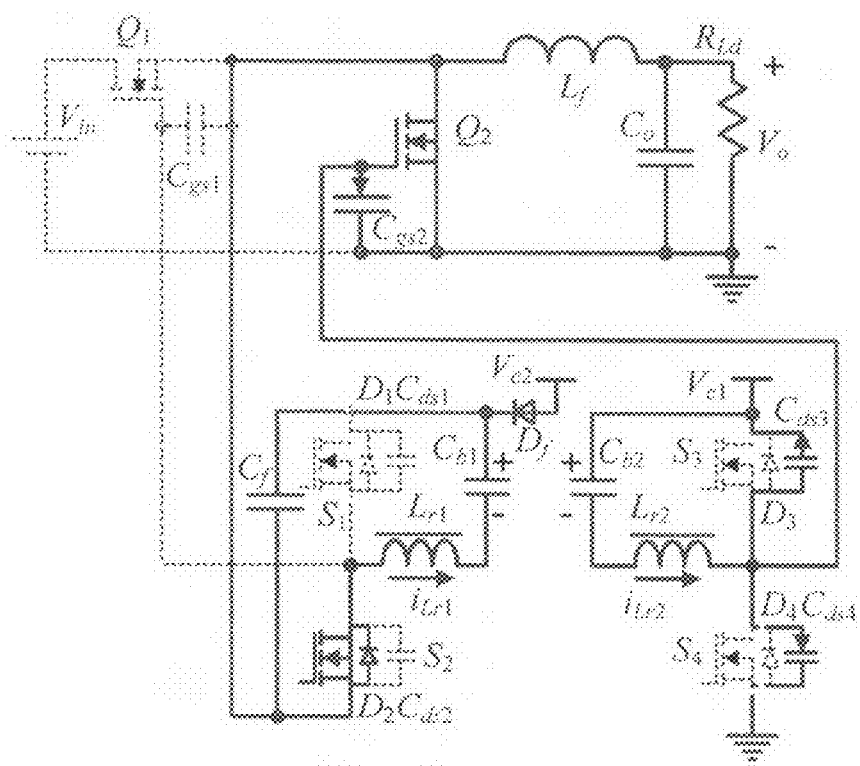
Figure 9E [$t_4$, $t_5$]
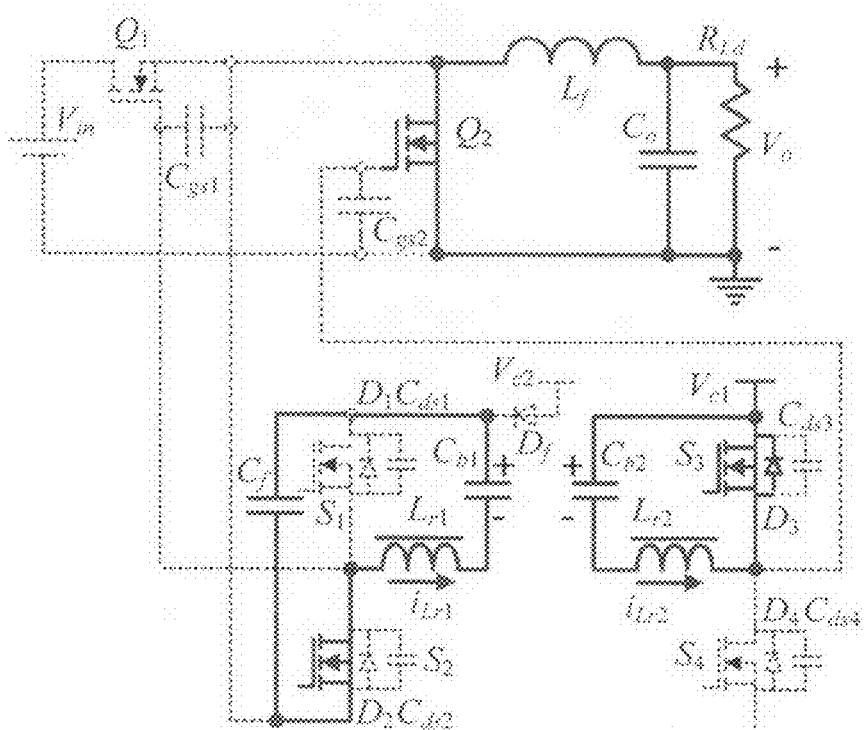
Figure 9F [$t_5$, $t_6$]

CURRENT-SOURCE GATE DRIVER

RELATED APPLICATION

This application claims the benefit of the filing date of U.S. Provisional Patent Application Ser. No. 61/064,233, filed Feb. 22, 2008, the content of which is hereby incorporated by reference in its entirety.

FIELD OF THE INVENTION

This invention relates to a gate driver for use in a voltage regulator module or other switching converter. In particular, this invention relates to a current-source gate driver for improving efficiency of each of the power switching devices of a voltage regulator module independently.

BACKGROUND OF THE INVENTION

To meet the strict transient requirements of future microprocessors and to reduce the number of passive components required to achieve high power density, the switching frequency of voltage regulators (VR) will move into the megahertz (MHz) range in the next few years [1]-[4].

However, an increase in switching frequency may lead to poor efficiency of the VR due to excessive switching loss and gate drive loss, which are proportional to the switching frequency. Consequently, overall performance of the VR will be degraded. More importantly, it has been shown that in applications such as a high frequency (1 MHz) synchronous buck VR, the parasitic inductance, especially the common source inductance, has a substantial propagation effect during the switching transition of the power switching devices and thus results in high switching loss [5].

The resonant gate drive technique has received considerable attention as an approach to recovering gate energy lost in conventional gate drivers. In the approach taken by Chen et al. [6], the power MOSFET gate was not actively clamped high or low, which resulted in poor noise immunity. Yao et al. proposed resonant drivers using a coupled inductor [7] or a transformer [8] that were able to drive two MOSFETs. However, the leakage inductance of these approaches becomes substantial at MHz frequency. A full-bridge topology drive circuit with one inductor to drive two ground-sharing MOSFETs in a 1 MHz Boost converter was proposed by Li et al. [9]. Dwane et al. [10] provided an assessment of resonant drive techniques for use in low power dc/dc converters, and Lopez et al. [11] constructed a mathematical model to estimate the power loss of a resonant drive circuit. However, all of these approaches focus on gate energy savings realized by the resonant gate driver, but do not consider the potential switching loss savings, which are more important in a VR and other switching converters operating at MHz frequencies.

In our previous work [12]-[16], we showed that use of a constant drive current in a resonant gate driver can significantly reduce the switching transition time and switching loss of power switching devices. Using a current-source topology for the driver in a buck VR, we demonstrated a significant improvement in efficiency over the conventional voltage driver at a switching frequency of 1 MHz. However, with that approach it was not possible to achieve control of the power switching devices independently.

SUMMARY OF THE INVENTION

According to a first aspect of the invention there is provided a current-source gate drive circuit for use with a switching device having a gate capacitance, comprising: an input terminal for receiving a DC voltage; a first switch connected between the input terminal and an output terminal; a second switch connected between the output terminal and a circuit common; a series circuit comprising a first capacitor and an inductor, the series circuit connected between the input terminal and the output terminal; wherein the gate capacitance of the switching device is connected between the output terminal and the circuit common.

The current-source gate driver may further comprise a second capacitor connected between a node between the first capacitor and the inductor, and the circuit common.

The current-source gate drive circuit may further comprise a third capacitor connected between the node and the inductor.

The switching device may be a synchronous power switching device of a buck converter, or a low side power switching device of a bridge leg.

A second aspect of the invention relates to a current-source gate drive circuit for use with a switching device having a gate capacitance, comprising: an input terminal for receiving a DC voltage; a rectifier connected between the input terminal and a first node; a first switch connected between the first node and an output terminal; a second switch connected between the output terminal and a floating point; a series circuit comprising a first capacitor and an inductor, the series circuit connected between the first node and the output terminal; and a second capacitor connected between the first node the floating point; wherein the gate capacitance of the switching device is connected between the output terminal and the floating point.

In one embodiment, the series circuit may be connected between the floating point and the output terminal.

The switching device may be a control power switching device of a buck converter.

The switching device may be a high side power switching device of a bridge leg.

A third aspect of the invention relates to a current-source gate drive circuit for use with a switching device having a gate capacitance, comprising: an input terminal for receiving a DC voltage; a rectifier connected between the input terminal and a first node; a first switch connected between the first node and an output terminal; a second switch connected between the output terminal and a floating point; a series circuit comprising a first capacitor and second capacitor, the series circuit connected between the first node and the floating point; and an inductor connected between a point between the first and second capacitors and the output terminal; wherein the gate capacitance of the switching device is connected between the output terminal and the floating point.

The current-source gate drive circuit may further comprise a third capacitor connected in series with the inductor, between the first and second capacitors and the output terminal.

The switching device may be a control power switching device of a buck converter.

The switching device may be a high side power switching device of a bridge leg.

A fourth aspect of the invention relates to a voltage regulator having a high side power switching device and a low side power switching device, each said power switching device having a gate capacitance, comprising: the current-source gate drive circuit of the first aspect, above, for driving the high side power switching device; and the current-source gate drive circuit of the second aspect, above, for driving the low side power switching device.

The inductor of the current-source gate drive circuit for driving the high side power switching device may share a magnetic component with the inductor of the current-source gate drive circuit for driving the low side power switching device.

A fifth aspect of the invention relates to a method of controlling switching of a switching device having a gate capacitance, comprising:

(a) providing a constant current source in a first direction to charge the gate capacitance of the switching device;

(b) clamping the voltage across the gate capacitance to a high value, to turn the switching device on;

(c) reversing direction of the constant current source to discharge the gate capacitance of the switching device; and (d) clamping the voltage across the gate capacitance to a low value, to turn the switching device off;

wherein the constant current source comprises an inductor current.

The switching device may be the high side power switching device or the low side power switching device of a voltage regulator or a bridge leg.

A sixth aspect of the invention relates to a method of controlling independently the switching of high side and low side power switching devices of a voltage regulator, each said power switching device having a gate capacitance, comprising: independently applying the above method to each of the high side and low side power switching devices of the voltage regulator.

In one embodiment, inductor currents applied to the high side and low side power switching devices are not equal.

Another embodiment may comprise applying the above method to the high side power switching device of the voltage regulator using a high inductor current; and applying the above method to the low side power switching device of the voltage regulator using a low inductor current.

The voltage regulator may be a buck converter.

In one embodiment, controlling may include repeating steps (a) to (d) once per cycle at a frequency of at least 300 kHz.

In another embodiment, the frequency is at least 1 MHz.

In the above embodiments, the switching device may be a power switching device selected from a MOSFET (metal oxide semiconductor field effect transistor), an IGBT (insulated gate bipolar transistor), and a MCT (MOS controlled thyristor).

BRIEF DESCRIPTION OF THE DRAWINGS

Embodiments of the invention will be described below, by way of example, with reference to the accompanying drawings, wherein:

FIGS. 3A-3D show equivalent circuits of the circuit of FIG. 1 for each of four switching modes during one complete switching cycle;

FIGS. 9A-9F show equivalent circuits of the circuit of FIG. 7 for each of six switching modes during one complete switching cycle;

DETAILED DESCRIPTION OF EMBODIMENTS OF THE INVENTION

Figure 1:
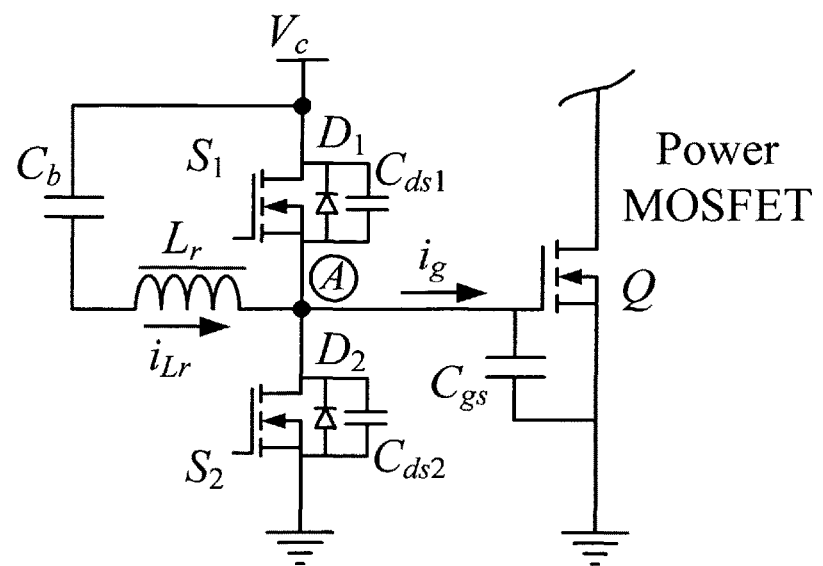
FIG. 1 is a schematic diagram of a generalized current-source gate drive circuit of the invention.

For the purpose of this description, the term MOSFET (metal oxide semiconductor field effect transistor) will be used as a non-limiting example for all switching devices, including power switching devices. It will be understood that other suitable devices, such as, for example, an IGBT (insulated gate bipolar transistor), or a MCT (MOS controlled thyristor), may be used for the power switching device. It will also be understood that other devices, such as a BJT (bipolar junction transistor, in which case a body diode (i.e., antiparallel diode) is required) may also be used for a drive switch of the current-source gate driver.

As known in the art, a switching device such as a FET has inherent capacitance. For example, for a FET, there is inherent capacitance between the gate terminal and the source terminal, between the drain terminal and source terminal, and between gate terminal and drain terminal.

As used herein, the terms "$C_{gs}$", "gate capacitance", "gate capacitor", "input capacitance", and "input capacitor" are interchangeable and refer to the inherent capacitance between the gate and source terminals of a FET switching device. Those of ordinary skill in the art will understand that the gate capacitance of a switching device is distinct from and does not include any discrete capacitor that may be connected to the gate of the switching device. Expressions such as "connected to the gate capacitance" and "connected to the gate capacitor" refer to a connection to the gate or control terminal of such switching devices.

As used herein, the terms "$C_{ds}$", "drain capacitance", "drain capacitor", "output capacitance", and "output capacitor" are interchangeable and refer to the inherent capacitance between the drain and source terminals of a FET switching device. Those of ordinary skill in the art will understand that the drain capacitance of a switching device is distinct from and does not include any discrete capacitor that may be connected to the drain of the switching device. Expressions such as "connected to the drain capacitance" and "connected to the drain capacitor" refer to a connection to the drain terminal of such switching devices.

As used herein, the term "$C_{gd}$" refers to the inherent capacitance between the gate and drain terminals of a FET switching device. Those of ordinary skill in the art will understand that the inherent capacitance between the gate and drain terminals of a FET switching device includes the "Miller capacitor" or "Miller capacitance" of the device, which is related to the gain of the device. The terms "$C_{gd}$", "Miller capacitor", and "Miller capacitance" may be used interchangeably herein. Those of ordinary skill in the art will also understand that the $C_{gd}$ of a switching device is distinct from and does not include any discrete capacitor that may be connected to the drain or gate of the switching device.

As used herein, the term "current-source" is intended to refer to an idealized current-source which may be approximated by at least a portion of the magnetizing current of a transformer winding, a current through an inductor, or the like. In embodiments of the current-source gate driver described herein, the time constant of the inductor and the equivalent capacitor (e.g., the sum of $C_{gs}$ and $C_{gd}$) of the power switching device is much larger (for example, 10 to 20 times larger) than the switching transition time (i.e., turn on time or turn off time) of the power switching device. With this condition, the inductor current does not change substantially during the switching transition time period. For example, any change in the inductor current may be less than 20% of the maximum inductor current during the switching transition time. In contrast, the time constant of the inductor and the equivalent gate capacitor in a resonant gate drive circuit is of the same order as the switching transition time. With this condition, the inductor current will change substantially (such as from zero to its maximum value) during the switching transition time.

In one aspect, the invention relates to an efficient current-source gate drive circuit for high frequency (i.e., $\geq 1$ MHz) applications. The drive circuit uses a constant inductor current to achieve fast charging and discharging of the input capacitor of the power switching device, which leads to significant reduction of the switching time and the switching loss. The current-source gate drive circuit returns energy to the supply voltage during intervals after the power switching device is turned on and after it is turned off.

It will of course be appreciated that the current-source gate drive circuits described herein may be used at frequencies below 1 MHz, such as, for example, 300 kHz to 1 MHz. As such, the current-source gate drive circuit may be used at VR operating frequencies typical of current VR designs (e.g., in the hundreds of kHz). Further, the upper limit of the operating frequency of the current-source gate drive circuits described herein may be determined by what is possible with currently available technology (e.g., up to 5 MHz), and is expected to increase as high frequency technology improves.

As will be described below, embodiments of the invention include current-source gate drive circuits for driving the low side (i.e., synchronous) power switching device and the high-side non-ground referenced (i.e., control) power switching device of a buck converter, also referred to herein as a buck VR module. Moreover, the drive switches of the gate drive circuits achieve zero-voltage-switching (ZVS) with near zero switching loss at very high frequency (i.e., $\geq 1$ MHz).

In one embodiment, the current-source gate drive circuit is configured for use with a synchronous buck converter. The gate drive circuit provides a high inductor current to achieve fast switching speed and reduce the switching loss for the high side (control) MOSFET, and provides a lower inductor current to achieve high efficiency of the gate energy recovery for the low side (synchronous) MOSFET. An additional benefit of fast switching speed of the power MOSETs is that the dead time between the control MOSFET and synchronous MOSFET is reduced, which reduces significantly both the body diode conduction loss and the reverse recovery loss.

In another embodiment the current-source gate driver includes adaptive voltage control, to improve light load efficiency. Under light load conditions, switching loss of a power MOSFET decreases greatly due to the lower load current, and therefore it is not necessary to drive the MOSFET with high drive current. Indeed, under light load conditions, the portion of the total power loss (i.e., the power loss of the VR plus the current-source gate driver) that is attributed to the current-source gate driver itself becomes greater. Because the power loss of the current-source gate driver depends on its supply voltage, one option is to reduce the supply voltage of the current-source driver circuit to reduce its power loss, and thereby reduce the total power loss under light load conditions. Therefore, in this embodiment, the supply voltage of the current-source gate driver is reduced according to the reduction of the load current, which leads to a reduction of the circulating current and of the resistive loss in the gate drive circuit to improve light load efficiency. Suitable methods to reduce the supply voltage include, for example, a low drop out linear regulator, a charge pump circuit, or a small DC-DC converter. A supply voltage of, for example 12V, may be reduced to a desired value, such as 8 V, or 5 V.

Another embodiment relates to a current-source gate driver with only one magnetic component, which may be made by integrating two inductors, to reduce the magnetic core number. Such an embodiment is well suited for use with a synchronous buck VR, and particularly for multiphase interleaved buck VRs, to reduce the complexity and cost of the VR circuit.

1.A. Current-Source Gate Drive Circuit

FIG. 1 shows an embodiment of the current-source gate drive circuit. It includes two drive switches $S_1$ and $S_2$, an inductor $L_r$, and a blocking capacitor $C_b$. Each drive switch $S_1$ and $S_2$ has a body diode, $D_1$ and $D_2$, respectively, and a drain capacitance $C_{ds1}$ and $C_{ds2}$, respectively. It will be understood by those of ordinary skill in the art that the body diodes and the drain capacitors are intrinsic or inherent to the switches $S_1$ and $S_2$, and are not discrete components. Vc is the drive voltage. Q is the power switching device (e.g., a MOSFET) and $C_{gs}$ is the gate capacitance of the MOSFET. $S_1$ and $S_2$ are complementarily controlled.

1.B. Principle of Operation

Figure 2:
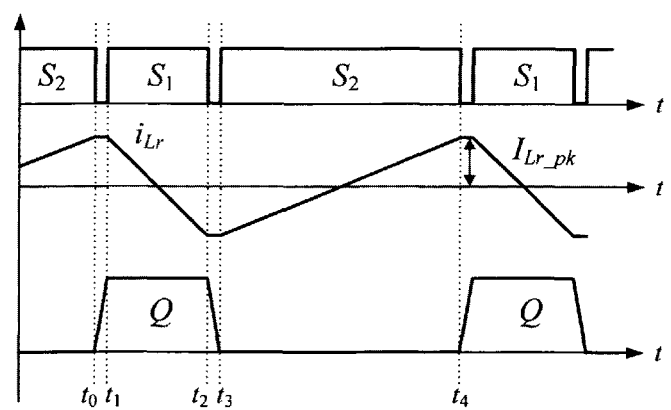
FIG. 2 is a timing diagram showing key waveforms of the circuit of FIG. 1.

FIG. 2 shows the key waveforms of the current-source drive circuit of FIG. 1. There are four switching modes in a one switching cycle and the equivalent circuits are shown in FIGS. 3A-3D.

1) Mode 1 [$t_0$, $t_1$] (FIG. 3A): Prior to $t_0$, $S_2$ conducts and the inductor current $i_{Lr}$ increases in the positive direction. At $t_0$, $S_2$ is turned off. The inductor current $i_{Lr}$ charges the drain capacitor $C_{ds2}$ of $S_2$ and the gate capacitor $C_{gs}$ of the MOSFET Q and discharges the drain capacitor $C_{ds1}$ of $S_1$ simultaneously. The inductor peak current $I_{Lr\_pk}$ can be regarded as a constant current-source during [$t_0$, $t_1$], which ensures very fast charging speed of the Miller capacitor of Q. Due to $C_{ds1}$ and $C_{ds2}$, $S_2$ is at zero-voltage turn-off. The voltage of $C_{ds2}$, $v_{c2}$, rises linearly and the voltage of $C_{ds1}$, $v_{c1}$, decays linearly.

2) Mode 2 [$t_1$, $t_2$] (FIG. 3B): At $t_1$, $v_{c2}$ rises to $V_c$ and $v_{c1}$ decays to zero. The body diode $D_1$ conducts and $S_1$ is turned on with zero-voltage condition. The gate-to-source voltage of Q is clamped to the drive voltage $V_c$ through $S_1$. From $t_1$, the inductor current $i_{Lr}$ decreases from the positive direction and then increases in the negative direction.

3) Mode 3 [$t_2$, $t_3$] (FIG. 3C): At $t_2$, $S_1$ is turned off. $i_{Lr}$ charges the drain capacitor $C_{ds1}$ of $S_1$ and discharges the drain capacitor $C_{ds2}$ of $S_2$ and the gate capacitor $C_{gs}$ of the MOSFET Q simultaneously. Due to $C_{ds1}$ and $C_{ds2}$, $S_1$ is at zero-voltage turn-off. The voltage of $C_{ds1}$ rises linearly and the voltage of $C_{ds2}$ decays linearly.

4) Mode 4 [$t_3$, $t_4$] (FIG. 3D): At $t_3$, $v_{c1}$ rises to $V_c$ and $v_{c2}$ decays to zero. The body diode $D_2$ conducts and $S_2$ is turned on with zero-voltage condition. The gate-to-source voltage of Q is clamped to ground through $S_2$.

1C. Features of the Current-Source Gate Drive Circuit

A portion of the power MOSFET gate energy may be recovered.

The driver achieves quick turn-on and turn-off of the power switching device, which reduces the switching loss of the power switching device significantly.

The driver uses a current source to drive the power switching device and reduces the negative impact of parasitic inductance, especially the common source inductance, at high frequency. It is noted that in a conventional VR, the propagation effect due to parasitic inductance during the switching transition results in very high switching loss at high frequency.

The drive switches $S_1$ and $S_2$ achieve ZVS operation, which leads to low switching loss at high frequency.

High noise immunity and alleviation of the dv/dt effect. The power switching device (e.g., MOSFET) gate is actively clamped high by $S_1$ and low by $S_2$, eliminating false triggering due to noise spikes.

The current-source drive circuit has simple structure and a low component count, which makes it suitable for integration into a gate drive IC chip. The complementary control scheme is also very simple.

2. Further Embodiments of the Current-Source Gate Drive Circuit

Figure 4A:
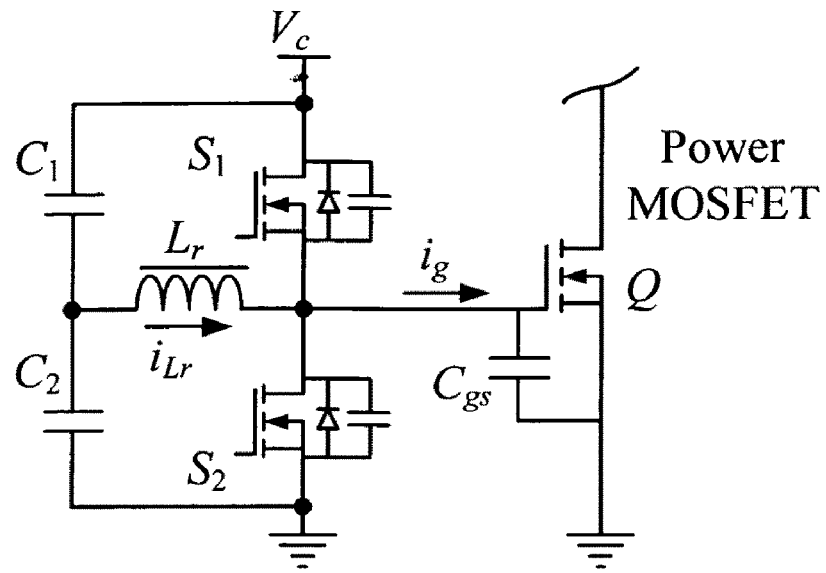
FIGS. 4A and 4B are schematic diagrams of alternative embodiments of the current-source gate drive circuit, suitable for driving a ground-referenced power switching device.
Figure 4B:
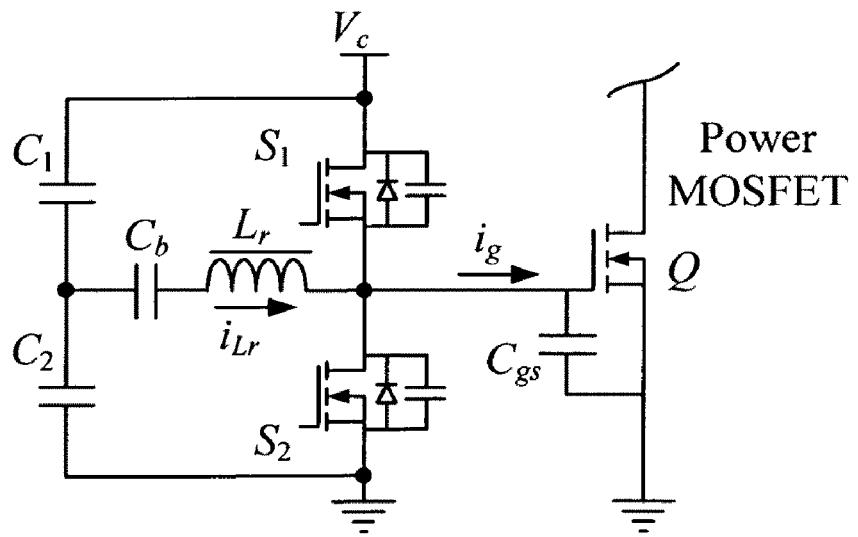

FIG. 4A and FIG. 4B show two further embodiments of the current-source gate drive circuit of FIG. 1. These circuits have the same features of the circuit of FIG. 1, and are based on the same principle of operation and have the same equivalent circuit. However, the embodiment of FIG. 1 requires fewer components. In FIGS. 4A and 4B, the body diodes $D_1$ and $D_2$, and drain capacitors $C_{ds1}$ and $C_{ds2}$ of each drive switch $S_1$ and $S_2$ are shown as in FIG. 1, but are not labelled. $C_1$ and $C_2$ form a capacitor divider to block the DC offset voltage over the inductor. These circuits are suitable for driving a ground-referenced power switching device, such as, for example, the low side (synchronous) MOSFET of a buck converter.

Figure 5A:
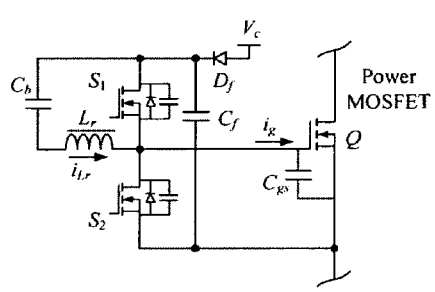
FIGS. 5A to 5D are schematic diagrams of alternative embodiments of the current-source gate drive circuit, suitable for driving a non-ground referenced power switching device.
Figure 5B:
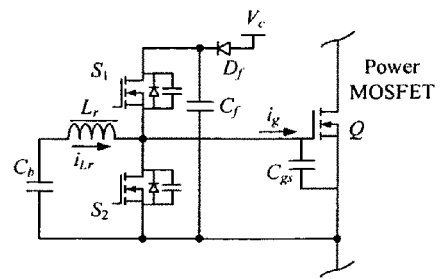
Figure 5C:
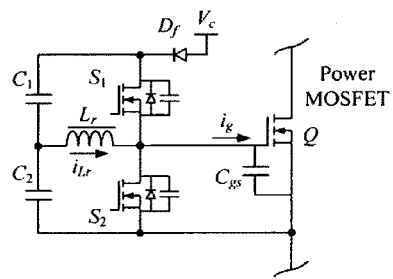
Figure 5D:
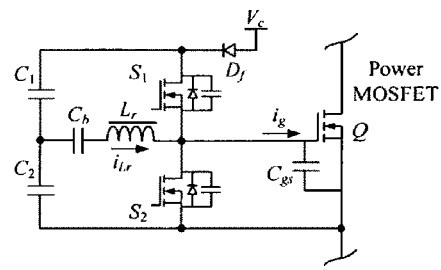

FIG. 5A shows an embodiment of the current-source gate drive circuit suitable for driving a non-ground referenced MOSFET such as, for example, the high side (control) MOSFET of a buck VR. The current-source gate driver includes a bootstrap circuit with a diode $D_f$ and flying capacitor $C_f$. In FIGS. 5A to 5D, the body diodes $D_1$ and $D_2$, and drain capacitors $C_{ds1}$ and $C_{ds2}$ of each drive switch $S_1$ and $S_2$ are shown as in FIG. 1, but are not labelled. FIGS. 5B, 5C, and 5D show further embodiments of the high side driver topology.

Figure 6:
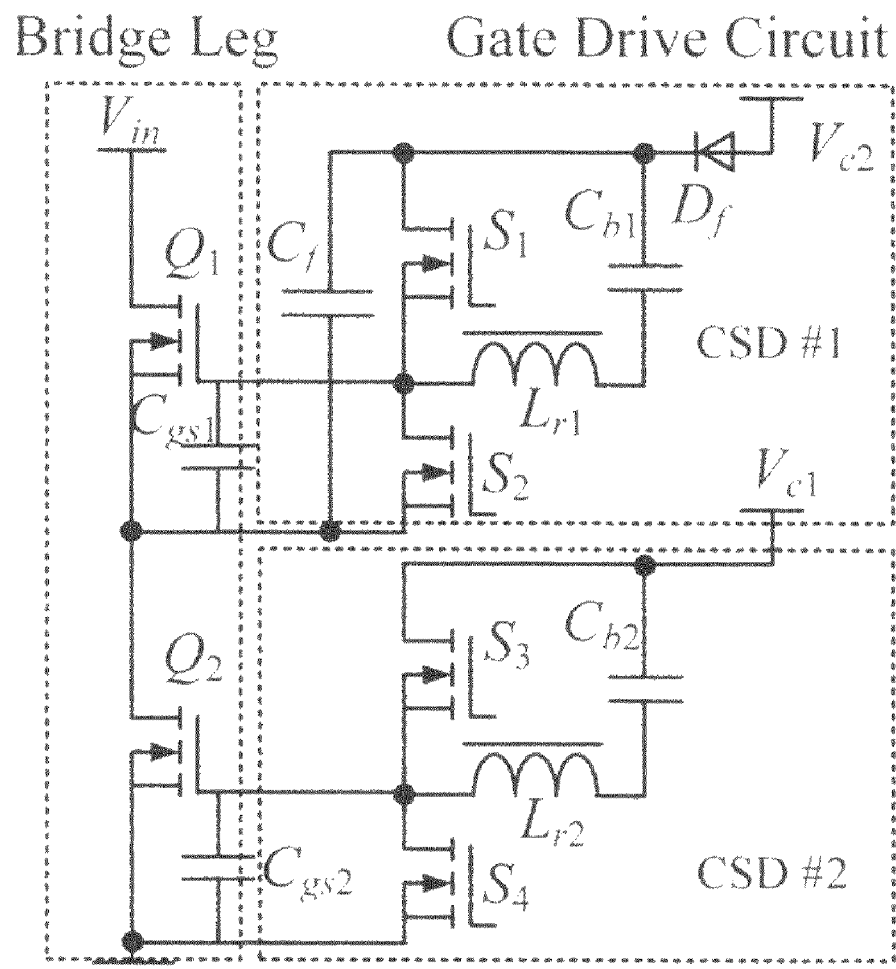
FIG. 6 is a schematic diagram showing the current-source gate drive circuit used to drive two power switching devices in a bridge leg.

The current-source gate drive circuit may also be used to drive two MOSFETs in a leg of a half-bridge topology or a full-bridge topology to achieve the switching loss reduction and gate energy savings, as shown in FIG. 6.

3.A. Current-Source Gate Drive Circuit for a Synchronous Buck Converter

A synchronous buck converter is the most popular VR topology used today. In a high frequency synchronous buck converter, the high-side switch (control MOSFET) exhibits very high switching loss due to the common source inductance, and the low side switch (synchronous MOSFET) exhibits high gate drive loss. The high current of the current-source drive circuits described herein achieves fast switching speed and reduces the switching loss significantly, but high current increases the circulating loss in the drive and reduces the efficiency of the gate energy recovery. To maximize the total loss savings, different currents may be used for the control MOSFET and the synchronous MOSFET.

Thus, one embodiment of the current-source gate driver described herein provides independent drive for the control MOSFET and the synchronous MOSFET in a buck VR. For the control MOSFET, this involves a tradeoff between switching loss reduction and drive circuit loss; while for the synchronous MOSFET, this involves a tradeoff between body diode conduction loss and drive circuit loss. Moreover, the gate drive current should not flow through the power MOSFET.

Figure 7:
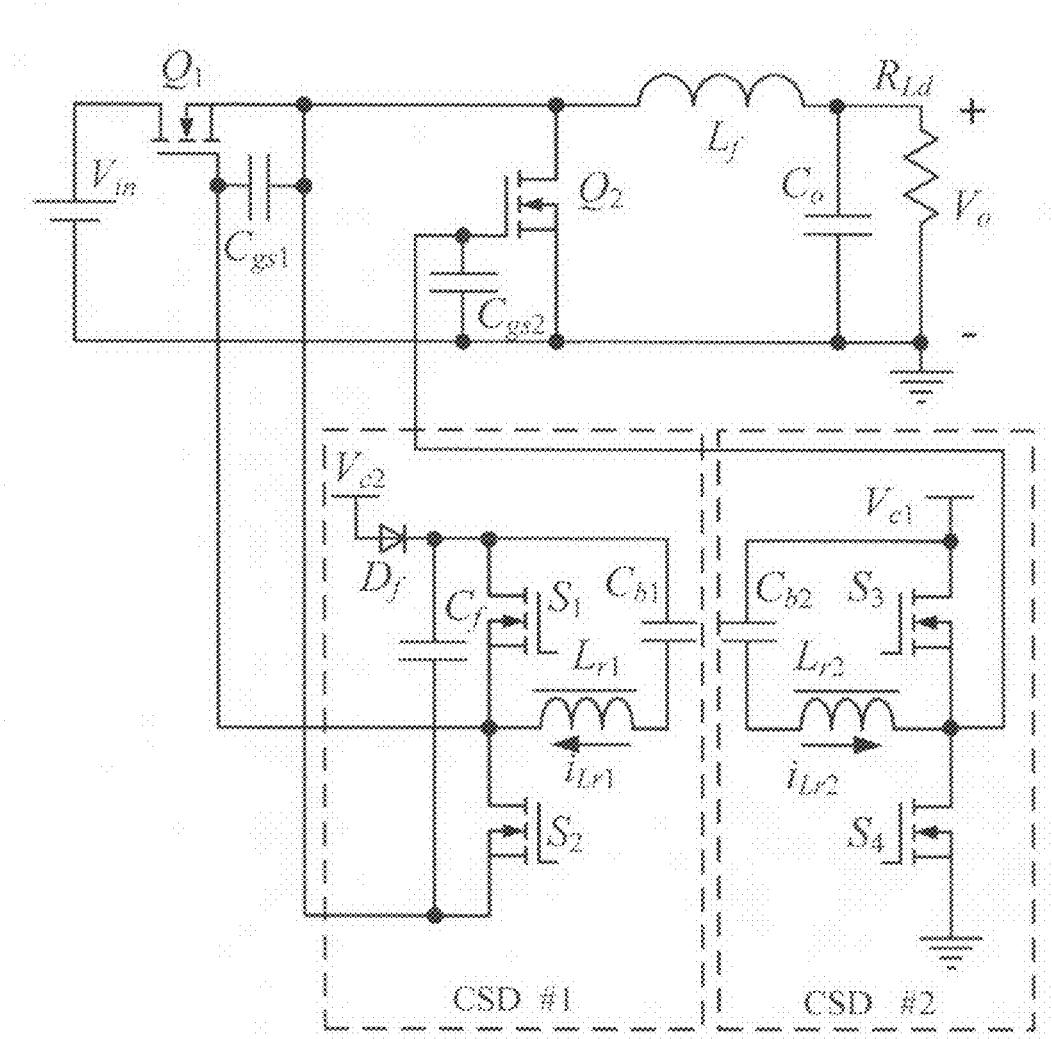
FIG. 7 is a schematic diagram showing two current-source gate drive circuits used to drive the control and synchronous MOSFETs of a buck VR according to an embodiment of the invention.

All the above features may be achieved by the circuit shown in FIG. 7, which includes a synchronous buck converter with current-source gate drive circuits for the control and synchronous MOSFETs. In this embodiment, current-source driver #1 (CSD#1) provides a high inductor current to achieve fast switching speed and reduce the switching loss for the control MOSFET, and current-source driver #2 (CSD#2) provides a lower inductor current to achieve high efficiency of the gate energy recovery for the synchronous MOSFET. In the buck converter of FIG. 7, $Q_1$ is the control MOSFET and $Q_2$ is the synchronous MOSFET. $C_{gs1}$ and $C_{gs2}$ are the inherent gate capacitances of $Q_1$ and $Q_2$ respectively. Current-source driver #1 and current-source driver #2 each have a half-bridge topology, consisting of drive switches $S_1$ and $S_2$, and $S_3$ and $S_4$, respectively. Current-source drivers #1 and #2 may be as shown in FIG. 7, or current-source driver #2 may be any one of the low-side drivers of FIG. 4A or 4B, and current-source driver #1 may be any one of the high-side drivers in FIG. 5A to 5D. With asymmetrical control, all the drive switches may achieve zero-voltage-switching (ZVS). CSD#1 may also be regarded as a level-shift version of CSD#2. $V_{c1}$ and $V_{c2}$ are the drive voltages, which may be the same or different voltage. The diode $D_f$ provides the path to charge $C_f$ to the voltage of the drive voltage $V_{c2}$. $C_{b1}$ and $C_{b2}$ are the blocking capacitors. $S_1$ and $S_2$ are switched out of phase with complimentary control to drive $Q_1$, while $S_3$ and $S_4$ are switched out of phase with complimentary control to drive $Q_2$.

Figure 8:
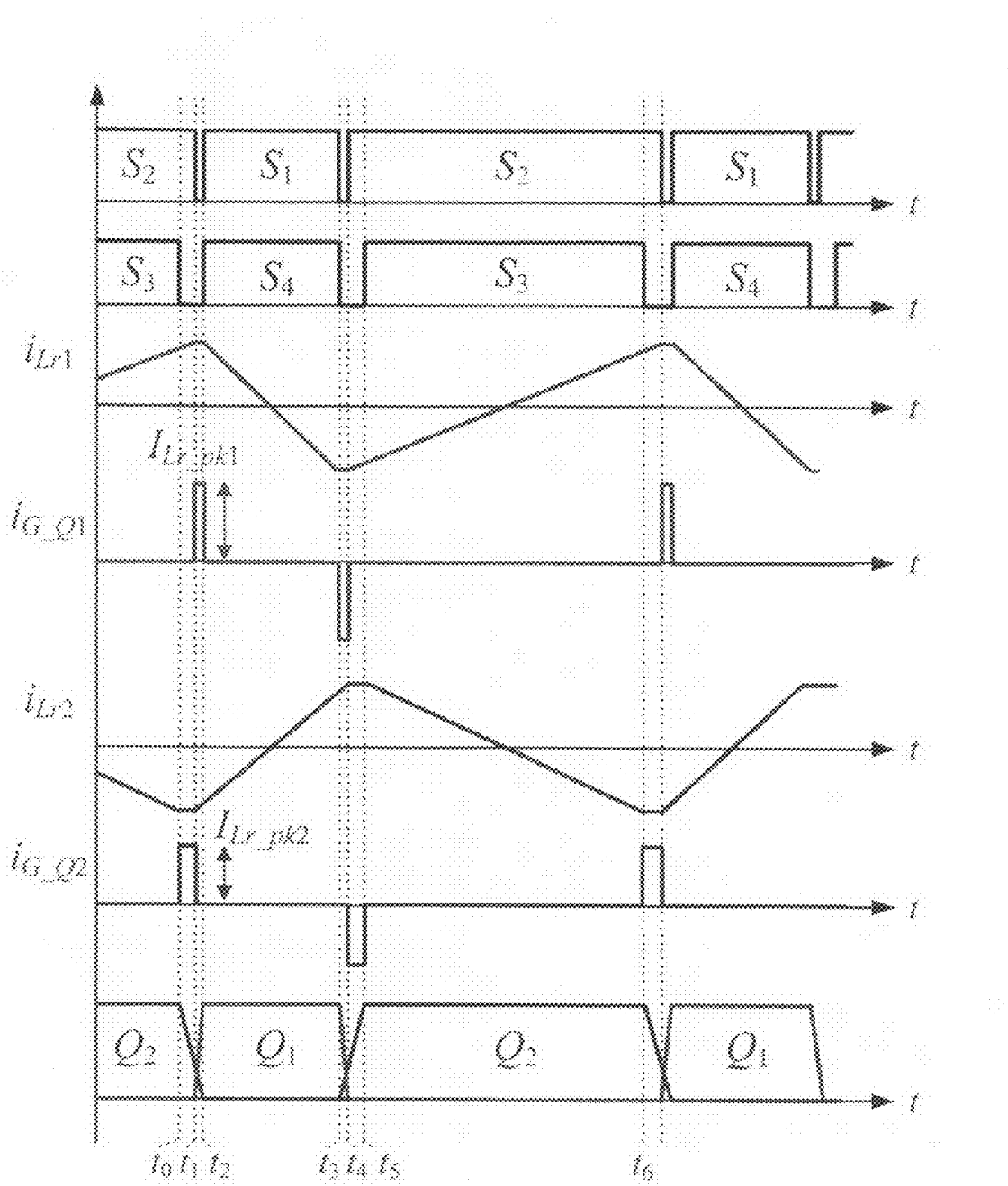
FIG. 8 is a timing diagram showing key waveforms of the current-source gate drive circuits and MOSFETS of FIG. 7.

The key waveforms for the circuit of FIG. 7 are shown in FIG. 8. The switching transitions of charging and discharging $C_{gs1}$ and $C_{gs2}$ are during the interval of $[t_0, t_2]$ and $[t_3, t_5]$. The peak currents $i_{G\_Q1}$ and $i_{G\_Q2}$ during $[t_0, t_2]$ and $[t_3, t_5]$ are constant during switching transition as seen in FIG. 8, which ensure fast charging and discharging of the gate capacitor and the gate to drain capacitor of $Q_1$.

The crossover level of the two gate signals is less than the threshold voltage of the switches so that the dead time may be minimized and shoot-through may also be avoided. This circuit has the features listed above in section 1C, and in addition, the reduced switching time provided by the current-source gate drivers also helps to reduce the dead time between the control MOSFET and synchronous MOSFET, and also reduces the conduction loss and the reverse recovery loss of the body diodes.

The current-source gate drivers described herein have excellent dynamic response. When the duty cycle has a step change during a transient, both of the current-source gate drivers may operate like conventional drivers regardless of the blocking capacitors and the inductors. Moreover, during the transient, the current-source driver for the synchronous MOSFET may be shut down by turning on $S_4$ and clamping the gate of the synchronous MOSFET to ground, which helps the VR have better dynamic response, due to the high forward voltage of the body diode of the synchronous MOSFET when a step-down load happens.

In burst-mode control of a VR under very light load conditions with variable frequency control, the current-source gate drivers may also operate similar to a conventional driver, except that a very small amount of the energy stored in the inductor will be dissipated on the resistance of the drive circuit. But since the dissipated energy is very small and the switching frequency is much lower under burst-mode control, the efficiency of the VR will not be substantially affected. Furthermore, the following methods may be employed to improve the light load efficiency: 1) reduce drive voltage of the control MOSFET to reduce the resistive loss of the circulating current and improve the recovery efficiency of the gate energy; and/or 2) shut down the synchronous MOSFET to eliminate its gate drive loss.

3.B. Principle of Operation

The principle of operation of the circuit of FIG. 7 will be described with reference to FIG. 8. There are six switching modes in a switching cycle and the equivalent circuits are given in FIGS. 9A-9F. $D_1$-$D_4$ are the body diodes and $C_{ds1}$-$C_{ds4}$ are the intrinsic drain capacitances of drive switches $S_1$-$S_4$ respectively.

1) Mode 1 $[t_0, t_1]$ (FIG. 9A): Prior to $t_0$, $S_2$ and $S_3$ conduct and the inductor current $i_{Lr1}$ increases in the positive direction while $i_{Lr2}$ increases in the negative direction. $Q_2$ is on. At to, $S_3$ turns off. $i_{Lr2}$ charges $C_{ds3}$ and discharges $C_{ds4}$ plus the input capacitor $C_{gs2}$ simultaneously. Due to $C_{ds3}$ and $C_{ds4}$, $S_3$ is at zero-voltage turn-off. The voltage of $C_{ds2}$ rises linearly and the voltage of $C_{ds4}$ decays linearly.

2) Mode 2 $[t_1, t_2]$ (FIG. 9B): At $t_1$, $v_{c3}$ rises to $V_{c1}$ and $v_{c4}$ decays to zero. The body diode $D_4$ conducts and $S_4$ turns on under zero-voltage condition. The gate-to-source voltage of $Q_2$ is clamped to ground through $S_4$. At $t_1$, $S_2$ turns off. $i_{Lr1}$ charges $C_{ds2}$ plus the input capacitor $C_{gs1}$ and discharges $C_{ds1}$ simultaneously. Due to $C_{ds1}$ and $C_{ds2}$, $S_2$ is at zero-voltage turn-off. The voltage of $C_{ds2}$ rises linearly and the voltage of $C_{ds1}$ decays linearly.

3) Mode 3 $[t_2, t_3]$ (FIG. 9C): At $t_2$, $V_{c2}$ rises to $V_{c2}$ and $v_{c1}$ decays to zero. The body diode $D_1$ conducts and $S_1$ turns on under zero-voltage condition. The gate-to-source voltage of $Q_1$ is clamped to $V_{c2}$ through $S_1$. $i_{Lr1}$ and $i_{Lr2}$ both decrease.

4) Mode 4 $[t_3, t_4]$ (FIG. 9D): Before $t_3$, $i_{Lr1}$ and $i_{Lr1}$ changed polarity respectively. At $t_3$, $S_4$ and $S_1$ turns off. $i_{Lr2}$ charges $C_{ds4}$ plus $C_{gs2}$ and discharges $C_{ds3}$ simultaneously. Due to $C_{ds3}$ and $C_{ds4}$, $S_4$ is at zero-voltage turn-off. The voltage of $C_{ds4}$ rises linearly and the voltage of $C_{ds3}$ decays linearly. $i_{Lr1}$ charges $C_{ds1}$ and discharges $C_{ds3}$ plus $C_{gs2}$ simultaneously. Due to $C_{ds1}$ and $C_{ds2}$, $S_1$ is at zero-voltage turn-off.

5) Mode 5 $[t_4, t_5]$ (FIG. 9E): At $t_4$, $v_{c1}$ rises to $V_{c2}$ and $V_{c2}$ decays to zero. The body diode $D_2$ conducts and $S_2$ turns on under zero-voltage condition. The gate-to-source voltage of $Q_1$ is clamped to zero through $S_2$.

6) Mode 6 $[t_5, t_6]$ (FIG. 9F): At $t_5$, $V_{c4}$ rises to $V_{c1}$ and $V_{c3}$ decays to zero. The body diode $D_3$ conducts and $S_3$ turns on under zero-voltage condition. The gate-to-source voltage of $Q_2$ is clamped to $V_{c1}$ through $S_3$.

3. C. Current-Source Gate Drive Circuit Loss Analysis

The two current-source drivers (#1 and #2) have similar drive losses except for different peak inductor currents. For each of them, the drive loss includes: 1) the resistive loss and gate drive loss of drive switches ($S_1$-$S_4$); 2) the loss of the inductor ($L_{r1}$ and $L_{r2}$); and 3) the resistive loss caused by the internal gate mesh resistance of the power MOSFETs.

From the volt-second balance condition across the inductor, the DC voltage $v_{cb}$ across the blocking capacitor $C_b$ is derived as Equation (I)

$$v_{Cb} = (1-D) \cdot V_c \qquad (1)$$

where D is the duty cycle of $S_1$ and $V_c$ is the drive voltage.

The relationship of the inductor value $L_r$ and the peak inductor current $I_{Lr\_pk}$ is given by Equation (2)

$$L_r = \frac{V_c \cdot D \cdot (1-D)}{2 \cdot I_{Lr\_pk} \cdot f_s} \qquad (2)$$

where D is the duty cycle of $S_1$, $V_c$ is the drive voltage and $f_s$ is the switching frequency. By choosing the proper peak inductor current (drive current for the MOSFET), the inductor value can be obtained by Equation (2).

The inductor current waveform indicated in FIG. 8 may be regarded as a triangular waveform since the charging/discharging time $[t_0, t_2]$ and $[t_3, t_5]$ are very small and can be neglected. Therefore, the RMS value of the inductor current $I_{Lr\_RMS}$ is $I_{Lr\_pk}/\sqrt{3}$.

Take driver #1 as an example. The RMS currents flowing through the switches $S_1$ and $S_4$ can be derived as $$I_{s1\_RMS} = I_{Lr\_pk1} \cdot \sqrt{\frac{D}{3}} \qquad (3)$$

The RMS currents flowing through switch $S_2$ is $$I_{s2\_RMS} = I_{Lr\_pk1} \cdot \sqrt{\frac{1-D}{3}} \qquad (4)$$

The conduction loss of $S_1$ and $S_2$ is expressed as $$P_{cond} = I_{s1\_RMS}^2 \cdot R_{ds(on)} + I_{s2\_RMS}^2 \cdot R_{ds(on)} \qquad (5)$$

Substituting (3) and (4) into (5) yields $$P_{cond} = \frac{1}{3} \cdot I_{Lr\_pk1}^2 \cdot R_{ds(on)} \qquad (6)$$

The copper loss of the inductor winding is expressed as $$P_{copper} = R_{ac} \cdot I_{Lr\_RMS1}^2 \qquad (7)$$

where $R_{ac}$ is the AC resistance of the inductor winding. $I_{Lr\_RMS1}$ is the RMS value of the inductor current. Core loss of the inductor should be also included. The total inductor loss is given in Equation (8):

$$P_{ind} = P_{copper} + P_{core} \qquad (8)$$

Both the charge and discharge currents flow through the internal gate mesh resistance RG of the power MOSFET and cause resistive loss. The charge and discharge current is the peak value of the inductor current. Thus the total loss caused by the internal resistance of the power MOSFET $Q_1$ during turn-on ($t_{on1}$) and turn-off ($t_{off1}$) is expressed as $$P_{RG} = R_{G1} I_{Lr\_pk1}^2 \cdot (t_{on1} + t_{off1}) \cdot f_s \qquad (9)$$

where $R_{G1}$ is the internal gate resistor of $Q_1$ and $f_s$ is the switching frequency.

The gate drive loss of $S_1$ and $S_2$ is expressed as $$P_{gate} = 2 \cdot Q_{g\_s} \cdot V_{gs\_s} \cdot f_s \qquad (10)$$

where $Q_{g\_s}$ is the total gate charge of a drive switch and $V_{gs\_s}$ is the drive voltage, which is typically 5V.

In conclusion, the total loss of current-source drive circuit of #1 is expressed as $$P_{Drive} = P_{cond} + P_{gate} + P_{ind} + P_{RG} \qquad (11)$$

3.D. Design of a Current-Source Gate Drive Circuit for a Buck Converter

One feature of the current-source gate drive circuit is that it can drive the control MOSFET and the synchronous MOSFET independently with different gate drive currents.

For the control MOSFET $Q_1$, this involves a tradeoff between the switching loss reduction and the drive circuit loss. We have described a design procedure based on an analytical loss model [16]. By following that procedure the peak inductor current may be determined, and then the inductor value may be calculated according to Equation (2).

For the synchronous rectifier MOSFET $Q_2$, this involves a tradeoff between body diode conduction loss and gate drive loss. The body diode conduction loss may be estimated using Equation (12).

$$P_{body\_Q2} = V_{body\_Q2} \cdot I_o \cdot f_s \cdot t_{body} \qquad (12)$$

In Equation (12), $t_{body}$ is body diode conduction time and it may be estimated using Equation (13). Equation (13) assumes that the body diode will conduct during the interval when the gate voltage is between the threshold and until the gate voltage is large enough so that $R_{ds(on)}$ of the synchronous MOSFET is less than about 20 mOhms, which means the voltage drop across the channel is less than the body diode drop. The values for $Q_{gQ2}(V_{20mohm})$ and $Q_{gQ2}(V_{thQ2})$ may be estimated using the MOSFET manufacturer datasheet and the body diode conduction time may be calculated as $$t_{body} = 2 \left[ \frac{Q_{gQ2}(V_{20mohm}) - Q_{gQ2}(V_{thQ2})}{I_{gQ2}} \right] \qquad (13)$$

Figure 10:
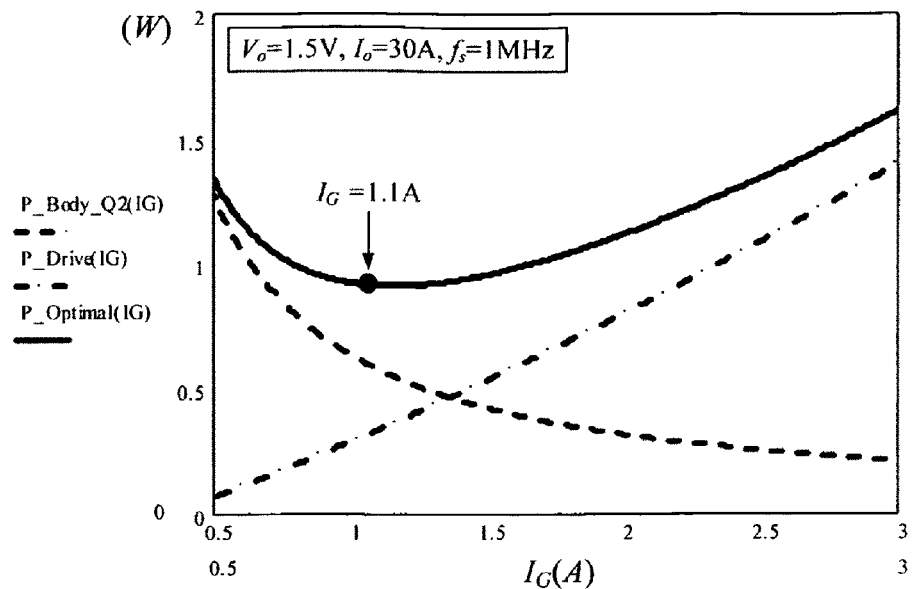
FIG. 10 is a plot showing optimization curves for a current-source gate driver for the synchronous rectifier MOSFET of a buck converter.

Using $P_{Drive}$ given in Equation (11), and $P_{body\_Q2}$ given by (12), the sum of the two loss components may be plotted as $P_{optimal}$ and the optimal gate current, $I_{G\_Q2}$ may be determined from the graph (at the minimum point of $P_{Optimal}$). For a buck converter and the parameters described below in the Working Example (section 5), the curves are given in FIG. 10. In FIG. 10, the optimal gate current is 1.1 A.

3. E. Current-Source Gate Drive Circuit with Integrated Inductor

It is observed from the waveforms of the two inductor currents $i_{Lr1}$ and $i_{Lr2}$ in FIG. 8 that $i_{Lr1}$ is almost a mirror image about the time axis of $i_{Lr2}$, which has a very good ripple cancellation effect of magnetic flux. This makes it possible to integrate the two inductors into one magnetic core.

Figure 11:
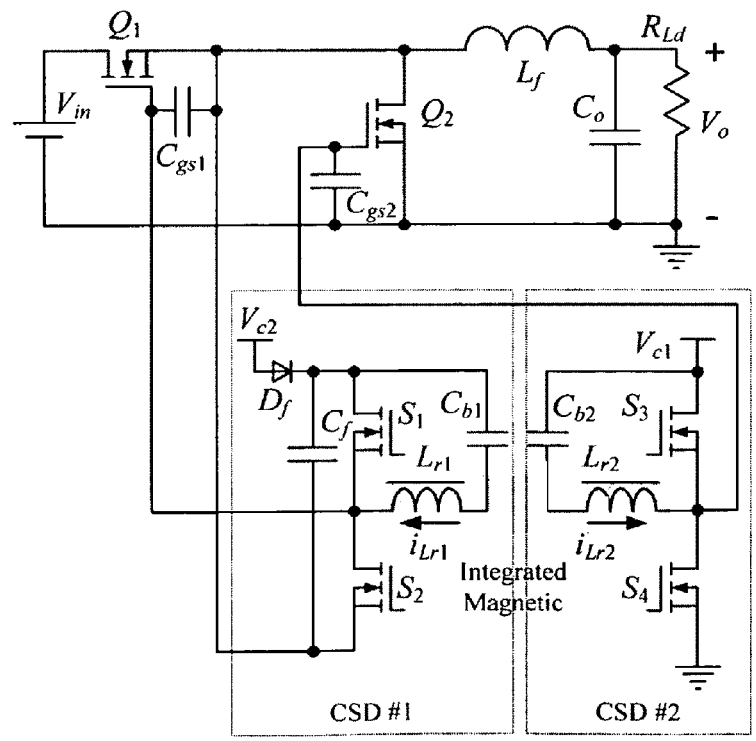
FIG. 11 is a schematic diagram showing two current-source gate driver circuits with an integrated inductor.

FIG. 11 shows the magnetic structure of the integrated inductors. It is noted that the references of the two driver circuits do not need to be the same. The reduction of components and of complexity resulting from integrated inductors is an important factor in multiphase applications of VRs such as buck converters. Although FIG. 11 shows this embodiment with a buck VR, it will of course be appreciated that this embodiment may be applied to other circuits.

Figure 12:
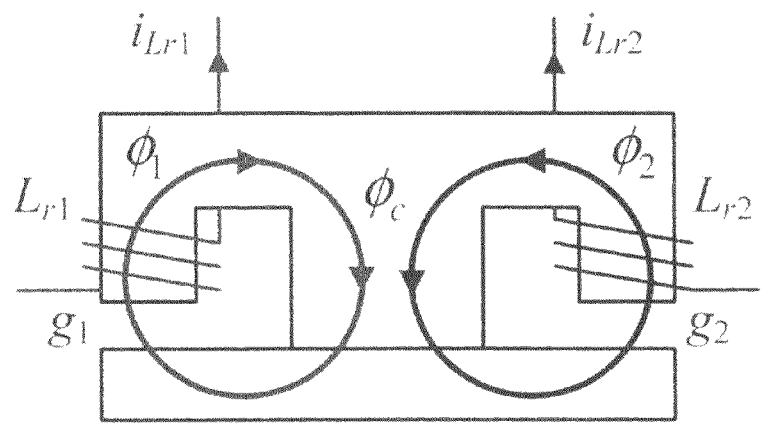
FIG. 12 is a diagram showing an integrated inductor structure suitable for the integrated inductor of FIG. 11.
Figure 13:
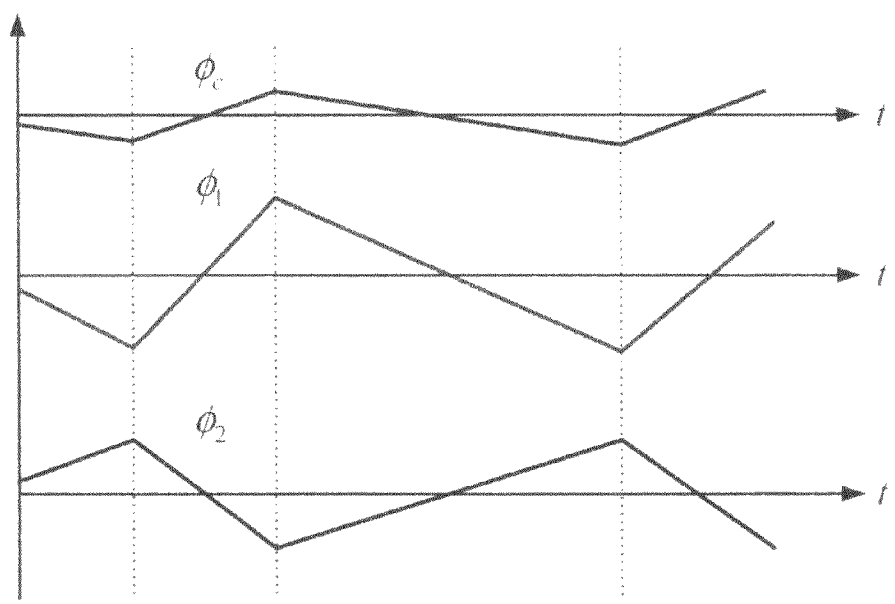
FIG. 13 is a plot showing the flux ripple cancellation effect of an integrated inductor.

FIG. 12 shows the current-source gate drivers with an integrated inductor. The two inductors ($L_{r1}$ and $L_{r2}$) are built on the two outer legs of one E-I core with two air gaps ($g_1$ and $g_2$) respectively. The fluxes $\Phi_1$ and $\Phi_2$ in the two outer legs generated by the two windings based on the directions of the currents will all flow through the center leg, which is a low-reluctance magnetic path with no air gap. Though $L_{r1}$ and $L_{r2}$ are built on the same E-I core, there is no interaction between the two flux loops of $\Phi_1$ and $\Phi_2$ and there is no coupling effect between $L_{r1}$ and $L_{r2}$. Therefore, the principle of operation of the current-source driver circuits with the integrated inductor does not change. However, the number of inductor cores is reduced from two to one. Another benefit of using the integrated inductor is that the flux $\Phi$ ($\Phi = \Phi_1 + \Phi_2$) in the center leg has smaller ripples owing to the flux ripple cancellation effect of the current $i_{Lr1}$ and $i_{Lr2}$, as shown in FIG. 13. The smaller flux ripple helps to reduce the core losses in the center leg at high frequency.

3.F. Example: Current-Source Gate Driver for Control and Synchronous Power Switches of a Synchronous Buck Converter To verify the functionality of the current-source gate drive circuit, preliminary tests were conducted with a 1 MHz synchronous buck converter. The specifications were as follows: input voltage $V_{in}=12$ V; output voltage $V_o=1.5$ V; output current $I_o=30$ A; switching frequency $f_s=1$ MHz; driver voltage $V_c=8$ V. The PCB was made from six-layer 2 oz copper. The components used in the circuit were as follows:

Control MOSFET $Q_1$: Si7860DP (30 V N-channel, $R_{DS(on)}=11$ m$\Omega$ @ $V_{GS}=4.5$ V, Vishay);

Synchronous MOSFET $Q_2$: Si7336ADP (30 V N-channel, $R_{DS(on)}=4$ m$\Omega$ @ ($V_{GS}=4.5$ V, Vishay);

Output filter inductance: $L_f=330$ nH (R=1.3 mohm, IHLP-5050CE-01, Vishay)

Inductors: $L_{r1}=1.0$ uH and $L_2=1.2$ uH

Figure 14:
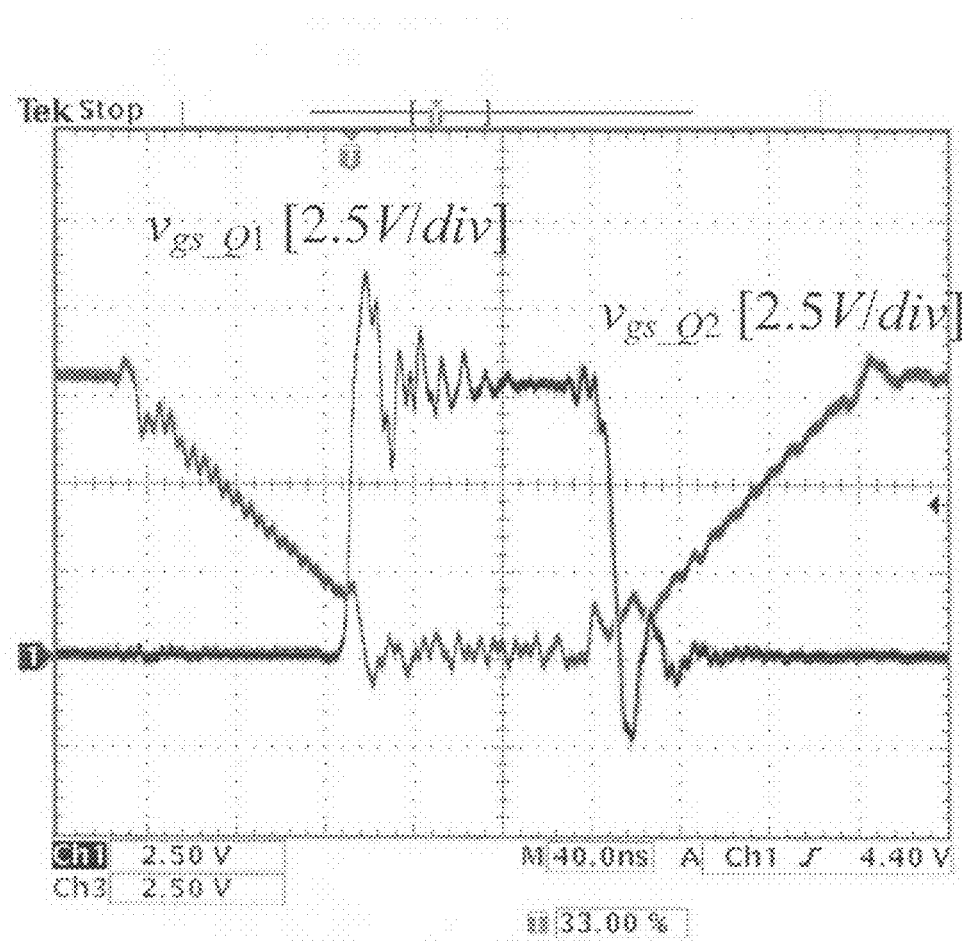
FIG. 14 is a trace showing gate signals for the control and synchronous MOSFETs of a buck converter built using the current-source gate drive circuit of FIG. 7.

FIG. 14 shows the gate drive signal $v_{gs\_Q1}$ (control MOSFET) and $v_{gs\_Q2}$ (synchronous MOSFET). The crossover level of these two gate signals is less than the threshold voltage of the switches, such that the dead time is minimized and shoot-through is avoided. It is observed that $v_{gs\_Q1}$ is very smooth and no Miller plateau is observed as the Miller charge (i.e., the charge in the Miller capacitor) was removed very fast with the constant charging current. Moreover, the rise time and fall time of $v_{gs\_Q1}$ is less than 15 ns, which means very fast switching speed.

Figure 15:
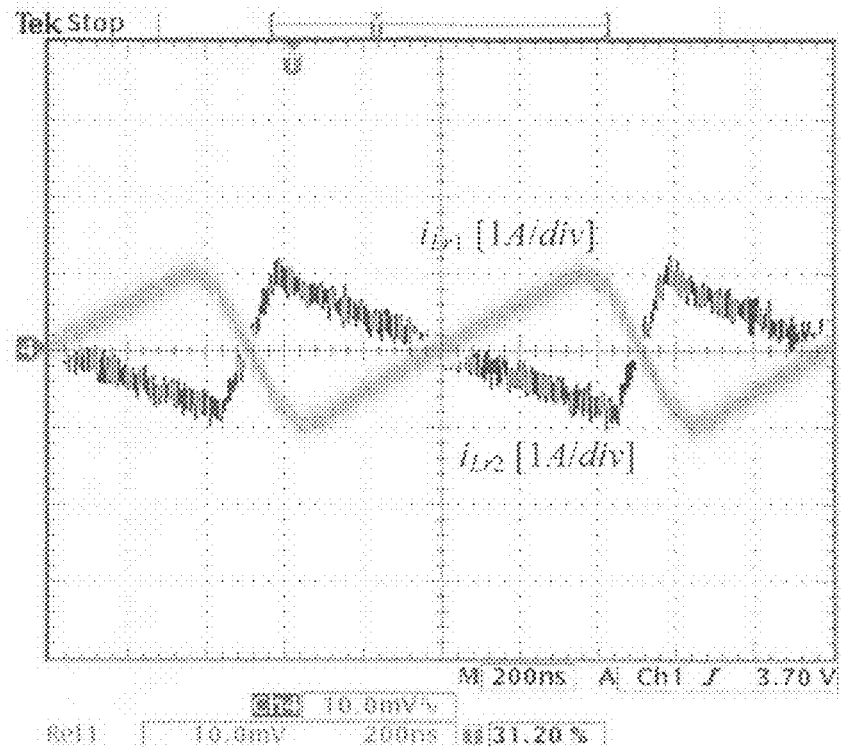
FIG. 15 shows traces of the inductor current waveforms of a buck converter built using the current-source gate drive circuit of FIG. 7, with two discrete inductors.
Figure 16:
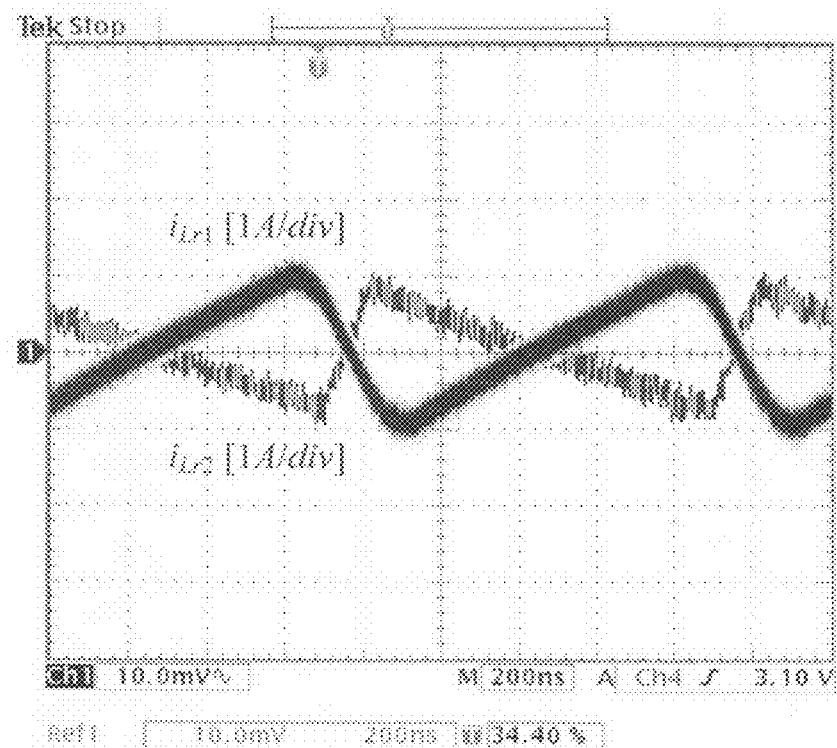
FIG. 16 shows traces of the inductor current waveforms of a buck converter built using the current-source gate drive circuit of FIG. 7, with an integrated inductor.

FIGS. 15 and 16 show the inductor current $i_{Lr1}$ and $i_{Lr2}$ with two inductors and with the integrated inductor, respectively. The observed mirror relationship between $i_{Lr1}$ and $i_{Lr2}$ confirms the feasibility of inductor integration and lower core loss due to the magnetic flux cancellation effect. Further, the data confirm that the integrated inductor does not change the principle of operation of the current-source gate drive circuit.

To illustrate the efficiency improvement provided by the current-source gate driver, a conventional synchronous buck converter with the same parameters, using a conventional gate driver, was built. A Predictive Gate Drive UCC 27222 from Texas Instruments was used as the conventional voltage-source gate driver.

Figure 17:
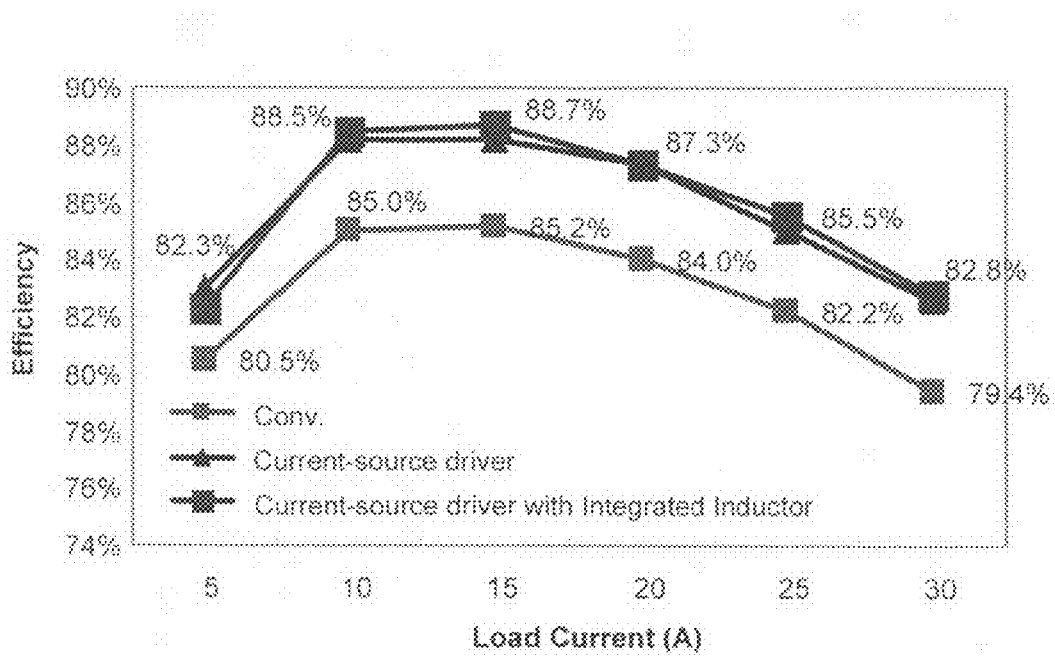
FIG. 17 is a plot comparing the efficiency of a buck converter having a conventional driver, a current-source gate driver with two discrete inductors, and a current-source gate driver having an integrated inductor.

FIG. 17 shows the measured efficiency comparison for the current-source gate driver and the conventional gate driver with an input voltage of 12 V and output voltage of 1.5 V. It is observed that at 20 A, the efficiency is improved from 84.0% to 87.3% (an improvement of 3.3%) and at 30 A, the efficiency is improved from 79.4% to 82.8% (an improvement of 3.4%). The data also show that the efficiency of the buck converter with the current-source gate driver with one integrated inductor was similar to that of the buck converter with the current-source gate driver with two discrete inductors.

Figure 18:
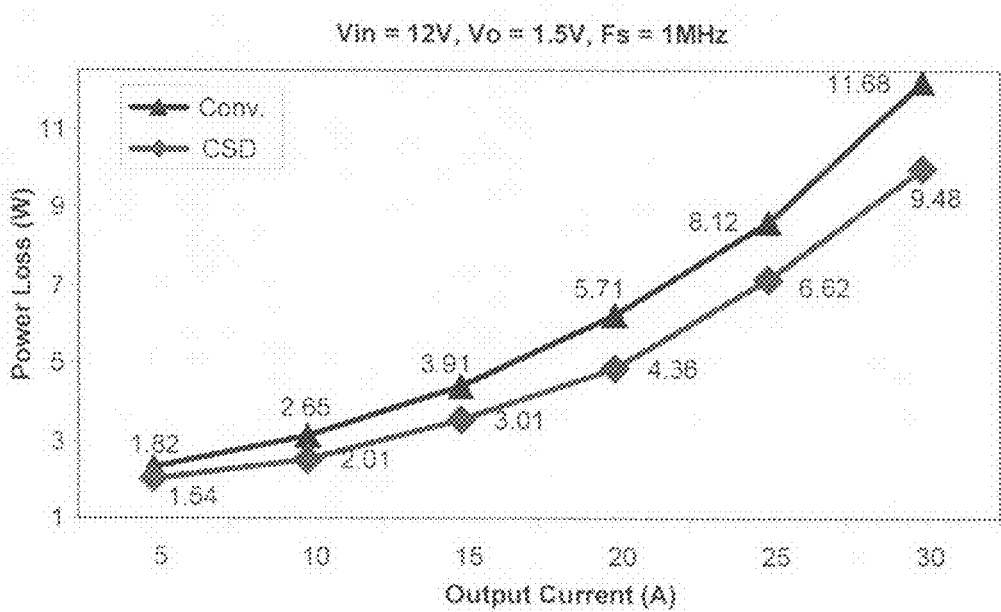
FIG. 18 is a plot comparing the power loss of a buck converter having a conventional driver to that of a buck converter having a current-source gate driver with two discrete inductors, for an output of 1.5 V and 30 A.

FIG. 18 shows the buck converter power loss comparison for the current-source gate driver and the conventional driver. It is noted that 30 A load, the current-source gate driver saves approximately 2.2 W (a reduction of 23%) compared to the conventional driver. This loss savings is significant for multiphase VRs. For example, in a five phase VR, the total loss savings would be 11 W.

An interesting observation is that if the power loss per phase is limited to 9.5 W, a buck converter with a conventional gate driver can only provide 26 A output current, while a buck converter with current-source gate driver can provide 30 A (an improvement of 15%). In other words, if the total output current is 120 A, 5 phases (26 A per phase) of the conventional gate driver are required, whereas only 4 phases (30 A per phase) of the current-source gate driver are required. This would yield a significant cost savings and space savings.

Figure 19:
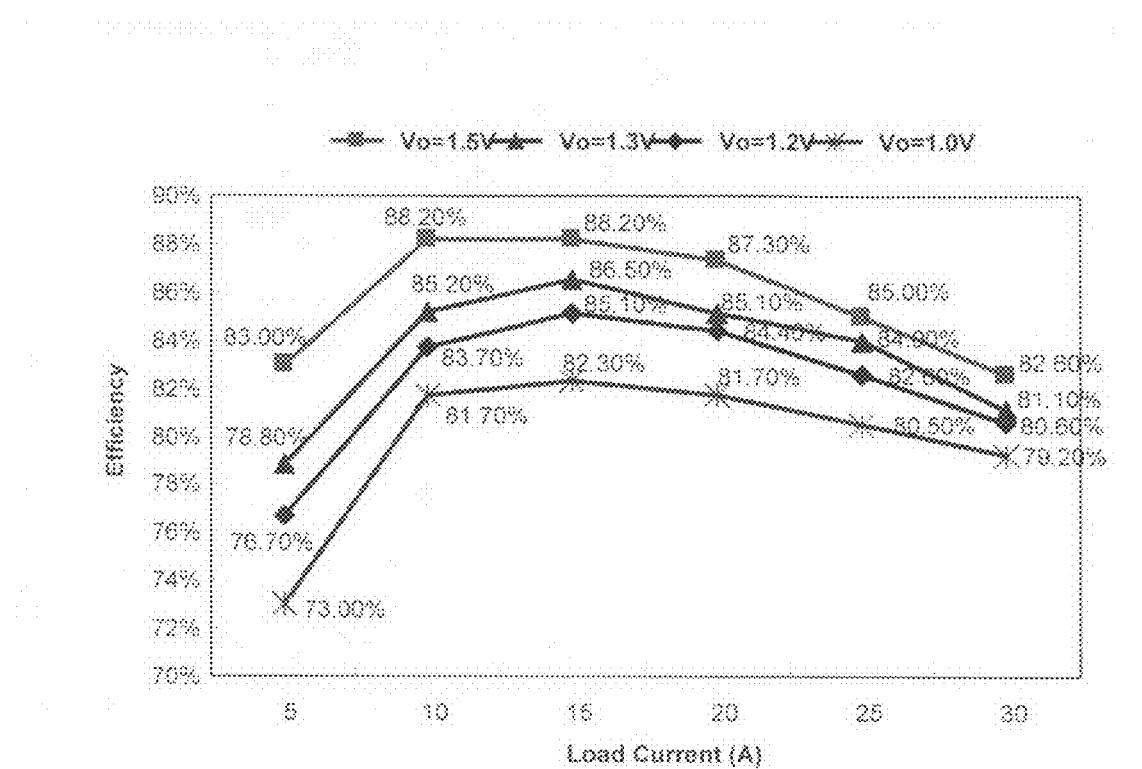
FIG. 19 is a plot comparing efficiency of a buck converter having a current-source gate driver with two discrete inductors, at output voltages of 1.0 V, 1.2 V, 1.3 V, and 1.5 V.

FIG. 19 shows the measured efficiency for the current-source gate driver at different output voltages and load currents.

4.A. Hybrid Current-Source Gate Drive Circuit for a Voltage Regulator

In certain applications it might not be cost-effective to implement current-source gate drive circuits for all of the power switching devices of a VR. For example, it might be practical to implement only one current-source gate drive circuit, for either the control or the synchronous power switch of a synchronous buck converter. Where only one current-source gate driver is to be used (with a conventional gate driver being used for the other power switch), the control power switch current-source gate driver may be used, as this driver contributes more to the overall improvement in efficiency than the synchronous power switch current-source gate driver.

Figure 20:
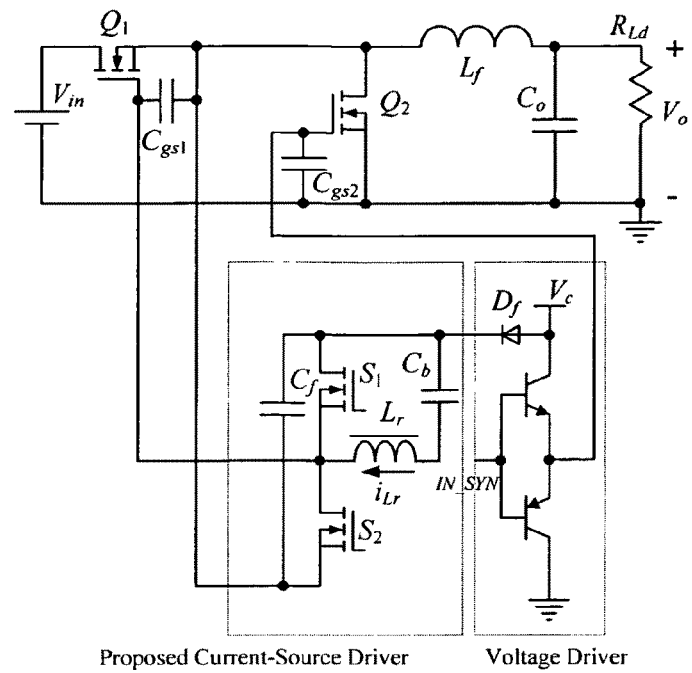
FIG. 20 is a schematic diagram of a hybrid current-source gate drive circuit for driving the control power switching device of a buck voltage regulator, according to another embodiment of the invention.
Figure 21:
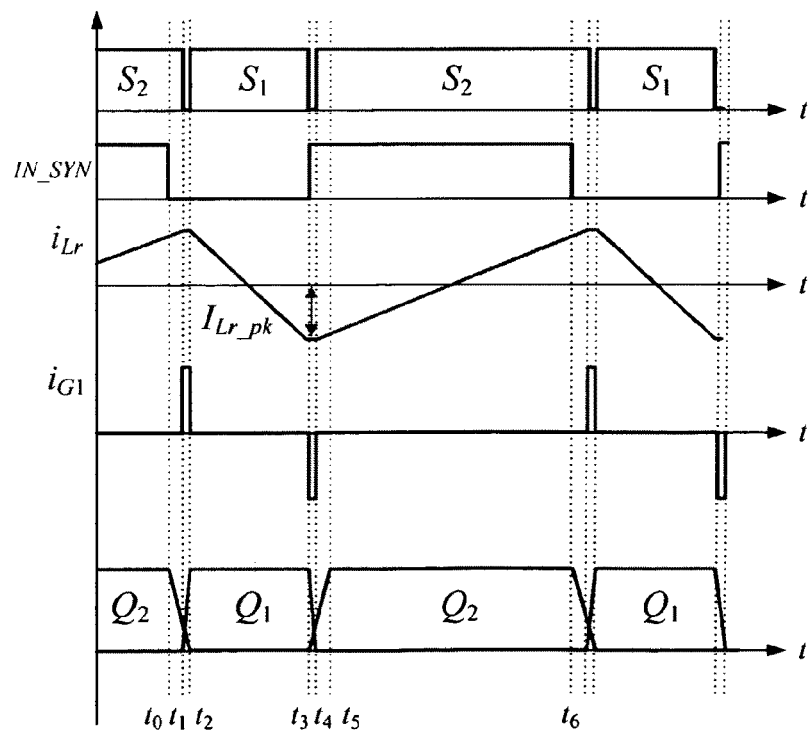
FIG. 21 shows key waveforms of the circuit of FIG. 20.

FIG. 20 shows a hybrid current-source gate drive circuit for the control power switch of a buck converter. The circuit consists of two drive switches $S_1$, $S_2$, an inductor $L_r$, a bootstrap capacitor $C_f$ and a blocking capacitor $C_b$. For the synchronous MOSFET, a conventional voltage driver is used, such as, for example, the bipolar totem-pole drive structure shown in FIG. 20, which features low cost and simplicity. $V_c$ is the drive voltage. $C_{gs1}$ and $C_{gs2}$ are the input gate capacitors of the two power MOSFETs $Q_1$ and $Q_2$. Key waveforms are shown in FIG. 21.

Figure 22A:
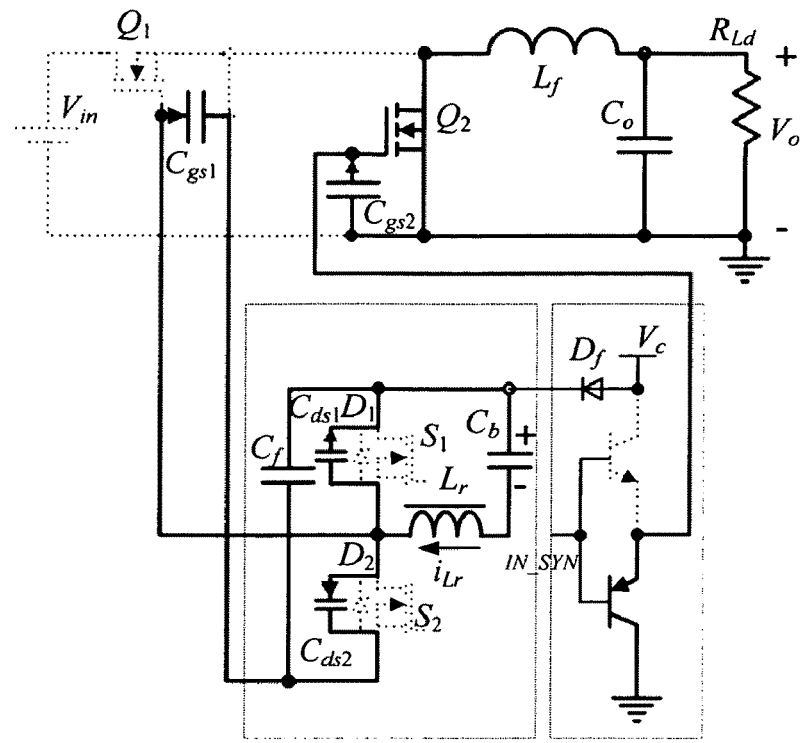
FIGS. 22A and 22B are schematic diagrams of equivalent circuits of the circuit of FIG. 20.
Figure 22B:
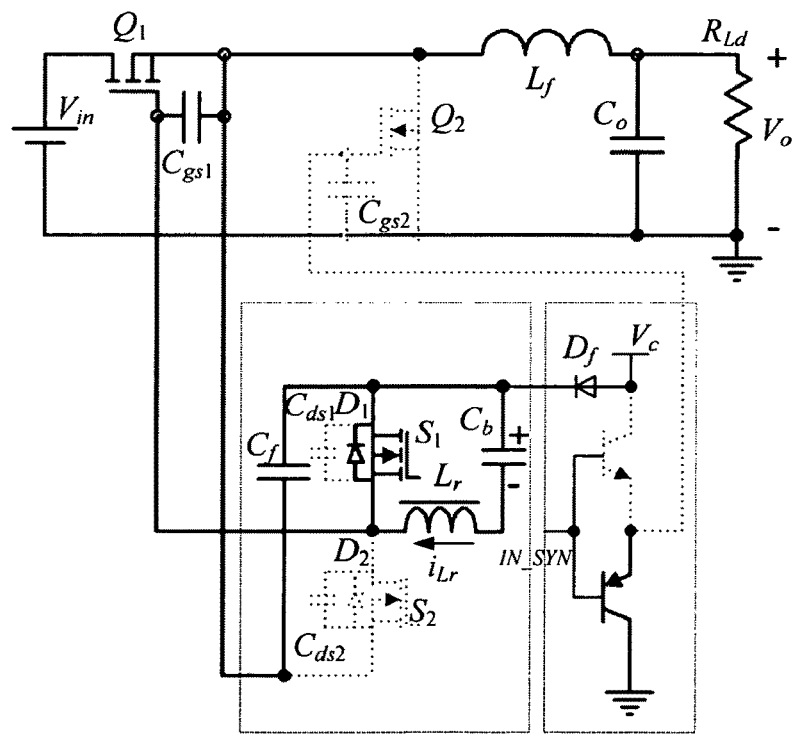

FIG. 22 shows the equivalent circuits of the turn-on interval of the control MOSFET. $D_1$ and $D_2$ are the body diodes, and $C_{ds1}$ and $C_{ds2}$ are the intrinsic drain-source capacitances of $S_1$ and $S_2$, respectively. With reference to FIGS. 21 and 22, operation of the circuit is described briefly as follows: In FIG. 22A, during $[t_0, t_1]$, the peak current $I_{Lr\_pk}$ flows through $L_r$, $C_f$, $C_b$ to charge $C_{gs1}$ and $C_{ds2}$ and discharge $C_{ds1}$. $C_{gs2}$ is discharged through the PNP bipolar transistor until $Q_2$ turns off. The voltage across $C_{gs1}$ increases until at $t_1$, it is clamped to $V_c$ by the body diode $D_1$ of $S_1$ as seen in FIG. 22B. At the same time, $S_1$ turns on under zero-voltage condition. Therefore, there is no switching loss of drive switches $S_1$ and $S_2$.

4. B. Design Considerations

To achieve design optimization, the loss analysis of the current-source gate driver is given. The total power loss of the current-source drive circuit includes: (1) the resistive loss and the gate drive loss of switches $S_1$ and $S_2$; (2) the loss of the inductor; and (3) the resistive loss caused by the internal gate mesh resistance of the control MOSFETs.

The relationship of the peak inductor current and the inductor value is given by Equation (14)

$$I_{Lr\_pk} = \frac{V_c \cdot D \cdot (1-D)}{2L_r \cdot f_s} \tag{14}$$

where $V_c$ is the gate drive voltage, which may be the input voltage of the buck converter; $T_s$ is the switching period; $L_r$ is the inductor value and D is the duty cycle of the control MOSFET $Q_1$.

As seen from the key waveforms in FIG. 21, the peak current $I_{Lr\_pk}$ of the inductor $L_r$ is regarded as the current source magnitude $I_G$. So the higher $I_{Lr\_pk}$ is, the shorter the switching transition is, thus more switching loss can be saved. On the other hand, higher $I_{Lr\_pk}$ will result in a larger RMS value of the inductor circulating current $i_{Lr}$ since the waveform of $i_{Lr}$ is triangular, which increases the resistive circulating loss in the drive circuit and decreases the gate energy recovery efficiency.

Following the optimal design method proposed in [15]-[16], the desired drive current $I_G$ may be obtained and thus the required inductor can be calculated from Equation (14).

4. C. Example: Hybrid Current-Source Gate Driver for a Synchronous Buck Converter To verify the performance of the hybrid current-source gate drive circuit, it was implemented for the control power MOSFET of a synchronous buck converter. The specifications were as follows: input voltage $V_{in}$=12 V; output voltage $V_o$=1.5 V; output current $I_o$=30 A; switching frequency $f_s$=1 MHz; driver voltage $V_c$=8 V. The PCB was constructed from six-layer 2 oz copper. The components used in the circuit were as follows: $Q_1$: Si7860DP; $Q_2$: Si7336ADP; output inductor: $L_f$=330 nH; inductor: $L_r$=1.0 uH.

Figure 23:
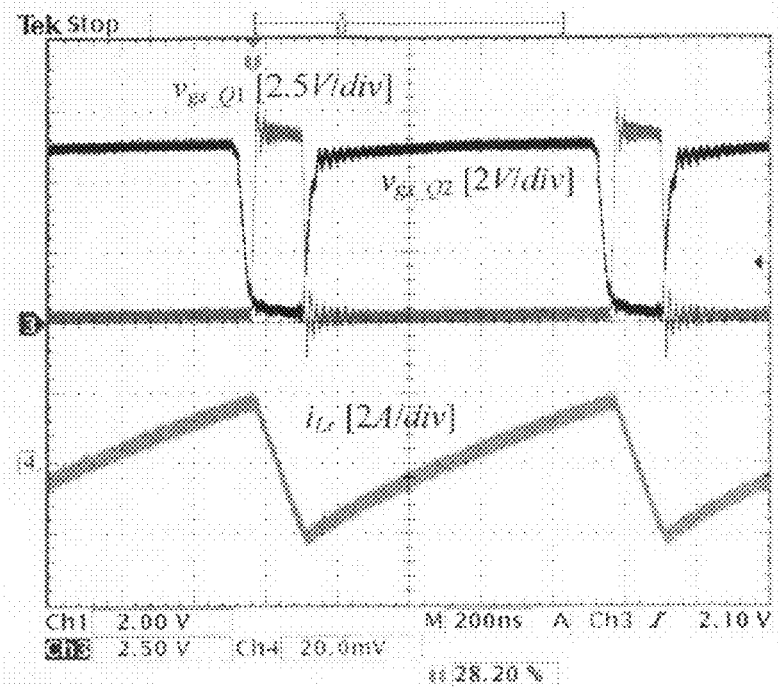
FIG. 23 shows traces of the gate signals and the inductor current of the circuit of FIG. 20.
Figure 24:
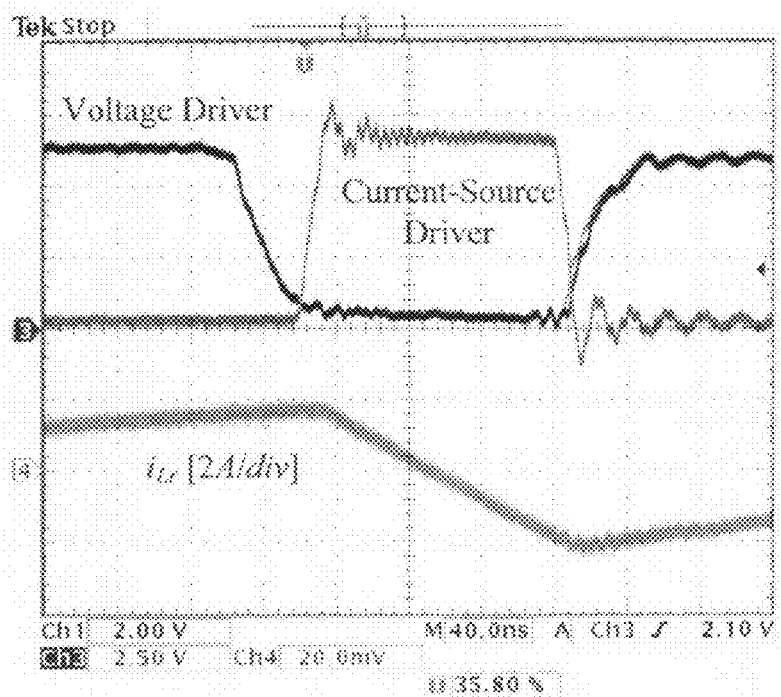
FIG. 24 shows traces of the voltage driver and current-source driver signals, and the inductor current of FIG. 20, for one cycle.

FIG. 23 shows the gate drive signals $v_{gs\_Q1}$ (control MOSFET), $v_{gs\_Q2}$ (synchronous MOSFET) and the inductor current $i_{Lr}$. FIG. 24 shows the waveforms for one cycle. It was observed that $v_{gs\_Q1}$ was very smooth and no Miller plateau was observed as the Miller charge was removed fast by the constant inductor drive current. Moreover, the rise time and fall time of $v_{gs\_Q1}$ was less than 15 ns, which results in fast switching speed. The crossover level of the two gate signals was less than the threshold voltage of the switches, so that the dead time was minimized and shoot-through was avoided.

Figure 25:
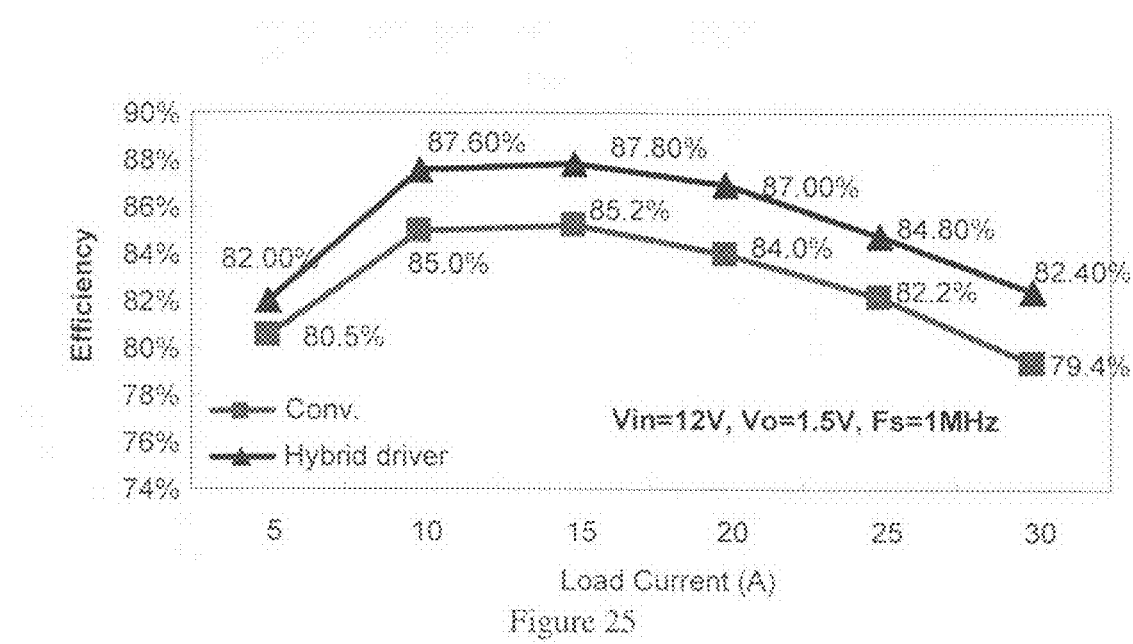
FIG. 25 is a plot comparing the efficiency of the circuit of FIG. 20 and of a buck converter with conventional gate drivers.

For comparison, a synchronous buck converter with conventional gate drivers was built. A Predictive Gate Drive UCC 27222 (Texas Instruments) was used as the conventional voltage driver. FIG. 25 shows the measured efficiency comparison for the current-source gate driver and the conventional gate driver at 1.5 V output. It was observed that at 20 A, the efficiency was improved from 84% to 87% (an improvement of 3.6%) and at 30 A, the efficiency was improved from 79.4% to 82.4% (an improvement of 3.8%). These preliminary experimental results demonstrate the increase in efficiency provided by the hybrid current-source gate drive circuit. This circuit requires only one small inductor (typically 400 nH to 800 nH at 1 MHz), thereby achieving low cost, small size, and a low profile.

The contents of all cited patents, patent applications, and publications are incorporated herein by reference in their entirety.

While the invention has been described with respect to illustrative embodiments thereof, it will be understood that various changes may be made to the embodiments without departing from the scope of the invention. Accordingly, the described embodiments are to be considered merely exemplary and the invention is not to be limited thereby.

REFERENCES

[1] L. Huber, K. Hsu, M. M. Jovanovic, D. J. Solley, G. Gurov and R. M. Porter, "1.8-MHz, 48-V resonant VRM: analysis, design, and performance evaluation," IEEE Trans. Power Electron., Vol. 21, No. 1, pp. 79-88, January 2006.
[2] J. Zhou, M. Xu; J. Sun and F. C. Lee, "A self-driven soft-switching voltage regulator for future microprocessors," IEEE Trans. Power Electron., vol. 20, no. 4, pp. 806-814, July 2005.
[3] Y. Ren, M. Xu, Y. Meng and F. C. Lee, "12V VR efficiency improvement based on two-stage approach and a novel gate driver," in Proc. IEEE PESC, 2005, pp. 2635-2641.
[4] M. Xu, Y. Ren, J. Zhou and Fred C. Lee, "1-MHz self-driven ZVS full-bridge converter for 48-V power pod and DC/DC brick," IEEE Trans. Power Electron., Vol. 20, No. 6, September 2005, pp. 997-1006.
[5] Y. Ren, M. Xu, J. Zhou and F. C. Lee, "Analytical loss model of power MOSFET," IEEE Trans. Power Electron., vol. 21, no. 2, pp. 310-319, March 2004.
[6] Y. Chen, F. C. Lee, L. Amoros and H. Wu, "A resonant MOSFET gate driver with efficient energy recovery," IEEE Trans. Power Electron., Vol. 19, No. 2, pp. 470-477, March 2004.
[7] K. Yao and F. C. Lee, "A novel resonant gate driver for high frequency synchronous buck converters," IEEE Trans. Power Electron., Vol. 17, No. 2, pp. 180-186, March 2002.
[8] Y. Ren, M. Xu, Y. Meng and F. C. Lee, "12V VR efficiency improvement based on two-stage approach and a novel gate driver," in Proc. IEEE PESC, 2005, pp. 2635-2641.
[9] Q. Li and P. Wolfs, "The power loss optimization of a current fed ZVS two-inductor boost converter with a resonant transition gate drive," IEEE Trans. Power Electron., Vol. 21, No. 5, September 2006, pp. 1253-1263.
[10] P. Dwane, D. O'Sullivan and M. G. Egan, "An assessment of resonant gate drive techniques for use in modern low power dc-dc converters," in Proc. IEEE APEC, 2005, vol. 3, pp. 1572-1580.
[11] T. Lopez, G. Sauerlaender, T. Duerbaum and T. Tolle, "A detailed analysis of a resonant gate driver for PWM applications," in Proc. IEEE APEC, 2003, pp. 873-878.
[12] Z. Yang, S. Ye and Y. F. Liu, "A new resonant gate drive circuit for synchronous buck converter," IEEE Trans. Power Electron., Vol. 22, No. 4, pp. 1311-1320, July 2007.
[13] Z. Zhang, Z. Yang, S. Ye and Y. F. Liu, "Topology and analysis of a new resonant gate driver", in Proc. IEEE PESC, 2006, Jeju, Korea, pp. 1453-1459.
[14] W. Eberle, Z. Zhang, Y. F. Liu, and P. C. Sen "A high efficiency synchronous buck VRM with current source gate driver" in Proc. IEEE PESC, 2007, Orlando, USA, pp. 21-27.
[15] W. Eberle, P. C. Sen and Y. Liu, "A novel high performance resonant gate drive circuit with low circulating current," in Proc. IEEE APEC, 2006, pp. 324-333.
[16] Z. Zhang, W. Eberle, Z. Yang, Y. F. Liu and P. C. Sen, "Optimal design of current source gate driver for a buck voltage regulator based on a new analytical loss model," in Proc. IEEE PESC, 2007, pp. 1556-1562.

The invention claimed is:

1. A current-source gate drive circuit comprising: an input terminal for receiving a DC voltage;
a first switch connected between the input terminal and an output terminal;
a second switch connected between the output terminal and a circuit common;
a series circuit consisting of a first capacitor and an inductor, the series circuit connected directly between the input terminal and the output terminal;
wherein the current source gate drive circuit is adapted to drive a gate capacitance of a switching device;
wherein the gate capacitance of the switching device is connected between the output terminal and the circuit common.

2. The current-source gate drive circuit of claim 1, further comprising a second capacitor connected between a node between the first capacitor and the inductor, and the circuit common.

3. The current-source gate drive circuit of claim 2, further comprising a third capacitor connected between the node and the inductor.

4. The current-source gate drive circuit of claim 1, wherein the circuit common is ground.

5. The current-source gate drive circuit of claim 1, wherein the switching device is a synchronous power switching device of a buck converter.

6. The current-source gate drive circuit of claim 1, wherein the switching device is a low side power switching device of a bridge leg.

7. The current-source gate drive circuit of claim 1, wherein the switching device is a power switching device selected from a MOSFET (metal oxide semiconductor field effect transistor), an IGBT (insulated gate bipolar transistor), and a MCT (MOS controlled thyristor).

8. A current-source gate drive circuit, comprising:
an input terminal for receiving a DC voltage;
a rectifier connected between the input terminal and a first node;
a first switch connected between the first node and an output terminal;
a second switch connected between the output terminal and a floating point;
a series circuit consisting of a first capacitor and an inductor, the series circuit connected directly between the first node and the output terminal; and
a second capacitor connected between the first node the floating point;
wherein the current-score gate drive circuit is adapted to drive a gate capacitance of a switching device;
wherein the gate capacitance of the switching device is connected between the output terminal and the floating point.

9. The current-source gate drive circuit of claim 8, wherein the series circuit is connected between the floating point and the output terminal.

10. The current-source gate drive circuit of claim 8, wherein the switching device is a control power switching device of a buck converter.

11. The current-source gate drive circuit of claim 8, wherein the switching device is a high side power switching device of a bridge leg.

12. The current-source gate drive circuit of claim 8, wherein the switching device is a power switching device selected from a MOSFET (metal oxide semiconductor field effect transistor), an IGBT (insulated gate bipolar transistor), and a MCT (MOS controlled thyristor).

13. A current-source gate drive circuit, comprising:
an input terminal for receiving a DC voltage;
a rectifier connected between the input terminal and a first node;
a first switch connected between the first node and an output terminal;
a second switch connected between the output terminal and a floating point;
a series circuit consisting of a first capacitor and second capacitor, the series circuit connected directly between the first node and the floating point; and
an inductor connected between a point between the first and second capacitors and the output terminal;
wherein the current-source gate drive circuit is adapted to drive a gate capacitance of a switching device;
wherein the gate capacitance of the switching device is directly connected between the output terminal and the floating point.

14. The current-source gate drive circuit of claim 13, further comprising a third capacitor connected in series with the inductor, between the first and second capacitors and the output terminal.

15. The current-source gate drive circuit of claim 13, wherein the switching device is a control power switching device of a buck converter.

16. The current-source gate drive circuit of claim 13, wherein the switching device is a high side power switching device of a bridge leg.

17. The current-source gate drive circuit of claim 13, wherein the switching device is a power switching device selected from a MOSFET (metal oxide semiconductor field effect transistor), an IGBT (insulated gate bipolar transistor), and a MCT (MOS controlled thyristor).

18. A voltage regulator having a high side power switching device and a low side power switching device, each said power switching device having a gate capacitance, comprising:
the current-source gate drive circuit of claim 1 for driving the high side power switching device; and
the current-source gate drive circuit of claim 7 for driving the low side power switching device.

19. The voltage regulator of claim 18, wherein the inductor of the current-source gate drive circuit for driving the high side power switching device shares a magnetic component with the inductor of the current-source gate drive circuit for driving the low side power switching device.

20. A method of controlling switching of a switching device having a gate capacitance, comprising:
providing a constant current source in a first direction to charge the gate capacitance of the switching device;
using a first switch to clamp the voltage across the gate capacitance to a high value to turn the switching device on;
reversing direction of the constant current source to discharge the gate capacitance of the switching device; and
using a second switch to clamp the voltage across the gate capacitance to a low value to turn the switching device off;
wherein the constant current source comprises an inductor current;
wherein the first switch and the second switch are the only switches used to control switching of the switching device having a gate capacitance;
further comprising using a series circuit consisting of a first capacitor and an inductor to produce the inductor current; the series circuit connected directly between an input voltage and an output terminal;
wherein the gate capacitance of the switching device is directly connected between the output terminal and a circuit common.

21. The method of claim 20, wherein the switching device is the high side power switching device or the low side power switching device of a voltage regulator or a bridge leg.

22. A method of controlling independently the switching of high side and low side power switching devices of a voltage regulator, each said power switching device having a gate capacitance, comprising:
independently applying the method of claim 20 to each of the high side and low side power switching devices of the voltage regulator.

23. The method of claim 22, wherein inductor currents applied to the high side and low side power switching devices are not equal.

24. The method of claim 22, further comprising:
applying the method of claim 20 to the high side power switching device of the voltage regulator using a high inductor current; and
applying the method of claim 20 to the low side power switching device of the voltage regulator using a low inductor current.

25. The method of claim 22, wherein the voltage regulator is a buck converter.

26. The method of claim 20, wherein controlling includes repeating steps (a) to (d) once per cycle at a frequency of at least 300 kHz.

27. The method of claim 26, wherein the frequency is at least 1 MHz.

* * * * *